United States Patent
Sun et al.

(10) Patent No.: US 11,694,711 B2
(45) Date of Patent: *Jul. 4, 2023

(54) POST-PROCESSING GAINS FOR SIGNAL ENHANCEMENT

(71) Applicant: Dolby Laboratories Licensing Corporation, San Francisco, CA (US)

(72) Inventors: Xuejing Sun, Beijing (CN); Glenn N. Dickins, Como (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/723,317

(22) Filed: Apr. 18, 2022

(65) Prior Publication Data

US 2022/0328060 A1    Oct. 13, 2022

Related U.S. Application Data

(60) Continuation of application No. 17/156,485, filed on Jan. 22, 2021, now Pat. No. 11,308,976, which is a (Continued)

(30) Foreign Application Priority Data

Mar. 23, 2012   (CN) .......................... 201210080971.2

(51) Int. Cl.
*G10L 21/0208* (2013.01)
*G10L 25/78* (2013.01)
(Continued)

(52) U.S. Cl.
CPC .......... *G10L 21/0364* (2013.01); *G10K 11/16* (2013.01); *G10L 21/0224* (2013.01);
(Continued)

(58) Field of Classification Search
CPC ............. G10L 21/0364; G10L 21/0224; G10L 21/0316; G10L 21/034; G10L 25/78; G10K 11/16; H03G 3/301; H03G 3/32
(Continued)

(56) References Cited

U.S. PATENT DOCUMENTS 4,630,305 A    12/1986  Borth
5,768,473 A *  6/1998  Eatwell .............. H03H 21/0012
                                          704/226
(Continued)

FOREIGN PATENT DOCUMENTS

CN    101383151    3/2009
CN    101599274    12/2009
(Continued)

OTHER PUBLICATIONS

U.S. Appl. No. 14/384,372.
(Continued)

*Primary Examiner* — Ammar T Hamid

(57) ABSTRACT

A method, an apparatus, and logic to post-process raw gains determined by input processing to generate post-processed gains, comprising using one or both of delta gain smoothing and decision-directed gain smoothing. The delta gain smoothing comprises applying a smoothing filter to the raw gain with a smoothing factor that depends on the gain delta: the absolute value of the difference between the raw gain for the current frame and the post-processed gain for a previous frame. The decision-directed gain smoothing comprises converting the raw gain to a signal-to-noise ratio, applying a smoothing filter with a smoothing factor to the signal-to-noise ratio to calculate a smoothed signal-to-noise ratio, and converting the smoothed signal-to-noise ratio to determine the second smoothed gain, with smoothing factor possibly dependent on the gain delta.

10 Claims, 11 Drawing Sheets

Related U.S. Application Data continuation of application No. 16/429,552, filed on Jun. 3, 2019, now Pat. No. 10,902,865, which is a continuation of application No. 15/433,437, filed on Feb. 15, 2017, now Pat. No. 10,311,891, which is a division of application No. 14/384,372, filed as application No. PCT/US2013/033251 on Mar. 21, 2013, now Pat. No. 9,584,087.

(60) Provisional application No. 61/618,503, filed on Mar. 30, 2012.

(51) Int. Cl.
| | |
|---|---|
| G10L 21/0364 | (2013.01) |
| G10L 21/0316 | (2013.01) |
| G10K 11/16 | (2006.01) |
| H03G 3/32 | (2006.01) |
| G10L 21/0224 | (2013.01) |
| G10L 21/034 | (2013.01) |
| H03G 3/30 | (2006.01) |

(52) U.S. Cl.
CPC ........ *G10L 21/034* (2013.01); *G10L 21/0316* (2013.01); *G10L 25/78* (2013.01); *H03G 3/301* (2013.01); *H03G 3/32* (2013.01)

(58) Field of Classification Search
USPC ................................................ 704/226, 500
See application file for complete search history.

(56) References Cited

U.S. PATENT DOCUMENTS

| | | | |
|---|---|---|---|
| 5,937,377 | A | 8/1999 | Hardiman |
| 6,088,668 | A | 7/2000 | Zack |
| 6,199,933 | B1 | 3/2001 | Gielda |
| 6,278,751 | B1 | 8/2001 | Uramoto |
| 6,315,396 | B1 | 11/2001 | Ozaki |
| 6,351,731 | B1 | 2/2002 | Anderson et al. |
| 6,415,253 | B1 | 7/2002 | Johnson |
| 6,453,289 | B1 | 9/2002 | Ertem et al. |
| 6,519,559 | B1 | 2/2003 | Sirivara |
| 6,577,675 | B2 | 6/2003 | Lindgren |
| 6,766,292 | B1 | 7/2004 | Chandran et al. |
| 6,781,820 | B2 | 8/2004 | Cheng |
| 6,903,098 | B1 | 6/2005 | Lubisch |
| 6,965,774 | B1 | 11/2005 | Kasapi |
| 7,072,477 | B1 | 7/2006 | Kincaid |
| 7,369,906 | B2 | 5/2008 | Frindle |
| 7,729,673 | B2 | 6/2010 | Romesburg |
| 8,989,884 | B2 | 3/2015 | Guetta |
| 9,240,763 | B2 | 1/2016 | Baumgarte |
| 9,294,062 | B2 | 3/2016 | Hatanaka |
| 9,300,268 | B2 | 3/2016 | Chen |
| 9,542,952 | B2 | 1/2017 | Hatanaka |
| 9,576,585 | B2 | 2/2017 | Bleidt |
| 9,607,624 | B2 | 3/2017 | Baumgarte |
| 9,608,588 | B2 | 3/2017 | Baumgarte |
| 9,633,663 | B2 | 4/2017 | Heuberger |
| 9,830,915 | B2 | 11/2017 | Schreiner |
| 9,836,272 | B2 | 12/2017 | Kono |
| 10,311,891 | B2 | 6/2019 | Sun |
| 10,902,865 | B2 * | 1/2021 | Sun ................. G10L 25/78 |
| 2003/0135364 | A1 | 7/2003 | Chandran et al. |
| 2003/0200092 | A1 | 10/2003 | Gao |
| 2003/0220786 | A1 | 11/2003 | Chandran |
| 2004/0101038 | A1 | 5/2004 | Etter |
| 2005/0143989 | A1 | 6/2005 | Jelinek |
| 2005/0213780 | A1 | 9/2005 | Berardi |
| 2005/0240401 | A1 | 10/2005 | Ebenezer |
| 2005/0278172 | A1 | 12/2005 | Koishida |
| 2006/0034447 | A1 | 2/2006 | Alves |
| 2006/0270467 | A1 | 11/2006 | Song et al. |
| 2008/0025530 | A1 | 1/2008 | Romesburg |
| 2008/0189104 | A1 | 8/2008 | Zong |
| 2009/0163168 | A1 | 6/2009 | Andersen |
| 2009/0254340 | A1 | 10/2009 | Sun et al. |
| 2009/0262841 | A1 | 10/2009 | Chalil |
| 2010/0008526 | A1 | 1/2010 | De Vries |
| 2010/0014695 | A1 | 1/2010 | Breithaupt |
| 2010/0119072 | A1 * | 5/2010 | Ojanpera ............ G10L 19/008 381/63 |
| 2010/0135507 | A1 | 6/2010 | Kino |
| 2010/0183158 | A1 | 7/2010 | Haykin |
| 2010/0296672 | A1 | 11/2010 | Vickers |
| 2011/0019833 | A1 | 1/2011 | Kuech |
| 2011/0044461 | A1 | 2/2011 | Kuech |
| 2012/0275625 | A1 | 11/2012 | Kono |
| 2013/0094669 | A1 | 4/2013 | Kono |
| 2016/0225376 | A1 | 8/2016 | Honma |
| 2016/0315722 | A1 | 10/2016 | Holman |
| 2016/0351202 | A1 | 12/2016 | Baumgarte |
| 2017/0092280 | A1 | 3/2017 | Hirabayashi |
| 2017/0223429 | A1 | 8/2017 | Schreiner |

FOREIGN PATENT DOCUMENTS

| | | |
|---|---|---|
| CN | 101908342 | 12/2010 |
| CN | 102149034 | 8/2011 |
| CN | 102157156 | 8/2011 |
| EP | 3089161 | 11/2016 |
| GB | 2456296 | 7/2009 |
| JP | 2004317993 | 11/2004 |
| WO | 9624127 | 8/1996 |
| WO | 0173759 | 10/2001 |
| WO | 2004111994 | 12/2004 |
| WO | 2010092568 | 8/2010 |
| WO | 2011131732 | 10/2011 |
| WO | 2012109384 | 8/2012 |
| WO | 2014111290 | 7/2014 |
| WO | 2014160849 | 10/2014 |
| WO | 2014160895 | 10/2014 |
| WO | 2015059087 | 4/2015 |
| WO | 2015088697 | 6/2015 |
| WO | 2015144587 | 10/2015 |
| WO | 2015148046 | 10/2015 |
| WO | 2016075053 | 5/2016 |
| WO | 2016193033 | 12/2016 |
| WO | 2016202682 | 12/2016 |
| WO | 2017023423 | 2/2017 |
| WO | 2017023601 | 2/2017 |
| WO | 2017058731 | 4/2017 |
| WO | 2016002738 | 5/2017 |

OTHER PUBLICATIONS

U.S. Appl. No. 15/433,437.
U.S. Appl. No. 16/429,552.
U.S. Appl. No. 17/156,485.
Favrot, A. et al., "Perceptually Motivated Gain Filter Smoothing for Noise Suppression," Audio Engineering Society, 123rd Convention, p. 7169, Oct. 1, 2007.
Kudumakis-107th MPEG San Jose (CA), USA, Jan. 13-17, 2014, Meeting Report Panos Kudumakis qMedia, Queen Mary University of London (7 pgs.).
Kudumakis—108th MPEG Valencia, Spain, Mar. 31-Apr. 4, 2014, Meeting Report Panos Kudumakis qMedia, Queen Mary University of London (9 pgs.).
O. Cappe, "Elimination of the Musical Noise Phenomenon with the Ephraim and Malah Noise Suppressor," IEEE Trans, Speech and Audio Proc. vol. 2 (2), Apr. 1994.
Xu, Rui-Jie, "Speech Enhancement Based on Improved Gain Function Spectral Subtraction Method," China Aerospace Science & Industry Corporation, Computer Engineering and Design, v 31, n 16, pp. 3681-3684, Aug. 28, 2010.
Y. Ephraim and D. Malah, "Speech Enhancement Using a Minimum Mean-Square Error Short-Time Spectral Amplitude Estimator," IEEE Trans. Acoustics, Speech, Signal Processing, vol. ASSP-32, pp. 1109-1121, Dec. 1984.

(56) References Cited

OTHER PUBLICATIONS

Y. Ephraim and D. Malah, "Speech Enhancement Using Aminimum Mean-Square Error Log-Spectral Amplitude Estimator," IEEE Trans. Acoustics, Speech, and Signal Processing, vol. 33, No. 2, pp. 443-445, Apr. 1985.

Yu, Doug et al., "Improvements on Mel-Frequency Cepstrum Minimum-Mean-Square-Error Noise Suppressor for Robust Speech Recognition," IEEE, Piscataway, NJ, 6th International Symposium on Chinese Spoken Language Processing, 4 pp., Dec. 16-19, 2008.

Zheng, Chengshi et al., "Two-Channel Post-Filtering Based on Adaptive Smoothing and Noise Properties," IEEE, International Conference on Acoustics, Speechm, and Signal Processing, ICASSP 2011—Proceedings, pp. 1745-1748, May 22-27, 2011.

* cited by examiner

POST-PROCESSING GAINS FOR SIGNAL ENHANCEMENT

CROSS-REFERENCE TO RELATED APPLICATIONS

This application is a continuation application of the U.S. patent application Ser. No. 17/156,485, filed Jan. 22, 2021, which is continuation application of the U.S. patent application Ser. No. 16/429,552, filed Jun. 3, 2019 (now U.S. Pat. No. 10,902,865), which is a continuation application of the U.S. patent application Ser. No. 15/433,437, filed Feb. 15, 2017 (now U.S. Pat. No. 10,311,891), which is a divisional application of the U.S. patent application Ser. No. 14/384,372, filed Sep. 10, 2014 (now U.S. Pat. No. 9,584,087), which is the National Stage of PCT/US2013/033251, filed Mar. 21, 2013, which in turn claims priority to the U.S. Patent Provisional Application No. 61/618,503, filed Mar. 30, 2012, and Chinese Patent Application No. 201210080971.2, filed Mar. 23, 2012, each of which is hereby incorporated by reference in its entirety.

FIELD OF THE INVENTION

The present disclosure relates generally to audio signal processing.

BACKGROUND

Noise reduction methods for reducing the noise in a single audio input signal that may include voice or other desired signal components typically determine a gain function to apply in the frequency domain to a frequency domain representation of the audio input signal. Many methods are known for such gain determination. We call such gain determination input processing. Due to many factors, e.g., non-stationarity of the actual noise that is present, estimation errors in the methods, and the general requirement that such a method remove only undesired signals to isolate the desired signal, applying the gain determined by such input processing may produce various artifacts, such as speech distortion and musical noise. Musical noise artifacts may be caused by estimation errors in the frequency domain which lead to spurious peaks in the spectral representation of the signal after the determined gain function is applied. When a result is transformed back to the time domain, these peaks correspond to a tonal excitation whose frequency content may vary randomly and unnaturally from frame to frame.

An input processing method and system as used herein means a method and system that determines gains for noise reduction using a priori signal-to-noise (SNR) estimation or a method and system that determines gains not based on a priori SNR. For example, an input processing system that has multiple inputs can determine gains derived from spatial features. An input processing system that has one or more reference signals can determine gains that achieve echo suppression. Input processing also can determine gains to carry out one or more of perceptual domain-based leveling, perceptual domain-based dynamic range control, and perceptual domain-based dynamic equalization that take into account the variation in the perception of audio depending on the reproduction level of the audio signal, as described, for example, in commonly owned WO 2004111994 titled "METHOD, APPARATUS AND COMPUTER PROGRAM FOR CALCULATING AND ADJUSTING THE PERCEIVED LOUDNESS OF AN AUDIO SIGNAL."

The outputs after application of such gains may be subject to musical noise or other types of artifacts.

DESCRIPTION OF EXAMPLE EMBODIMENTS

Figure 1A:
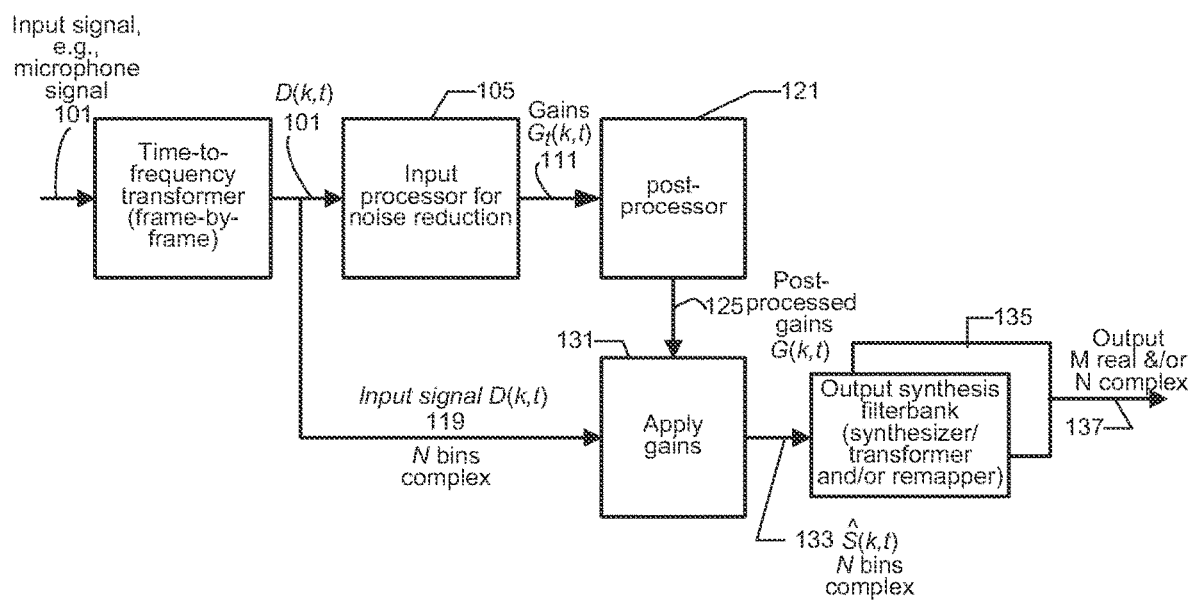
FIG. 1A shows a block diagram of one example embodiment of processing an input audio signal, e.g., a microphone signal, including an embodiment of the present invention.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be used without departing from the principles described herein.

Overview

Embodiments of the present invention include a method, an apparatus, and logic encoded in one or more computer-readable tangible medium to carry out a method. The method is to post-process raw gains determined by input processing.

Particular embodiments include a method of operating a processing apparatus, comprising post-processing raw gains determined by input processing one or more input signals. The post-processing is to generate post-processed gains to apply to a signal. The post-processing comprises determining a post-processed gain for each frequency bin of a set of frequency bins using one or both of delta gain smoothing to determine a first smoothed gain and decision-directed gain smoothing to determine a second smoothed gain, and determining the post-processed gain from one or both of the first smoothed gain and the second smoothed gain. The delta gain smoothing comprises applying a smoothing filter to the raw gain with a smoothing factor that depends on the absolute value of the difference between the raw gain for the current frame and the post-processed gain for a previous frame. The decision-directed gain smoothing comprises converting the raw gain to a signal-to-noise ratio, applying a smoothing filter whose smoothing level is controlled by a smoothing factor to the signal-to-noise ratio to calculate a smoothed signal-to-noise ratio, and converting the smoothed signal-to-noise ratio to determine the second smoothed gain.

In one version, the post-processing comprises the delta gain smoothing with the smoothing factor weighted by a power function of the gain delta.

In another version, the post-processing comprises decision-directed gain smoothing. In one such version, the smoothing factor of the smoothing filter for the signal-to-noise ratio depends on the absolute value of the difference between the raw gain for the current frame and the post-processed gain for a previous frame.

One version includes determining the first smoothed gain using delta gain smoothing, determining the second smoothed gain using decision-directed gain smoothing, and combining the first and the second smoothed gains to generate the post-processed gain.

Particular embodiments include a tangible computer-readable storage medium comprising instructions that when executed by one or more processors of a processing system cause processing hardware to carry out a method of post-processing gains for applying to a signal as described by the above method embodiments.

Particular embodiments include program logic that when executed by at least one processor causes carrying out a method as described by the above method embodiments.

Particular embodiments include an apparatus comprising one or more processors and a storage element, the storage element comprising instructions that when executed by at least one of the one or more processors causes the apparatus to carry out a method as described by the above method embodiments.

Particular embodiments may provide all, some, or none of these aspects, features, or advantages. Particular embodiments may provide one or more other aspects, features, or advantages, one or more of which may be readily apparent to a person skilled in the art from the figures, descriptions, and claims herein.

Some Example Embodiments

One aspect of the invention includes processing of gains for gain smoothing, the gains being for noise reduction or for other input processing.

FIG. 1A shows one example of processing an input audio signal 101, e.g., a microphone signal 101 including an embodiment of the present invention. The processing is by time frames of a number, e.g., M samples. Denote by an index t the time frame. A time-to-frequency transformer accepts sampled input audio signal(s) 101, e.g., in overlapping time frames as is common in the art, and carries out a time-to-frequency transform. In one embodiment, the time-to-frequency transformer implements a short time Fourier transform (STFT). For computational efficiency, the transformer uses a discrete finite length Fourier transform (DFT) implemented by a fast Fourier transform (FFT). Other embodiments use different transforms.

Denote by k the frequency bin of the transformed signal, $k=0, \ldots, N-1$ and by $D(k,t)$ the input signal in the frequency domain.

Denoted herein by $G_r(k,t)$ the gains determined for bins k, $k=0, \ldots, N-1$ at time index by the input processing of input processor 105, e.g., that determines gain according to a noise reduction method. For single channel solutions, the methods typically but not necessarily operate in two steps. First, a noise spectrum estimator is used which tracks the noise component in the input signal $D(k,t)$. Second, the noise-reduced signal, denoted $\hat{S}(k,t)$, $k=0, \ldots, N-1$ at time index t, is determined by applying the gain function $G_r(k,t)$ to the frequency domain representation $D(k,t)$ of the input signal. $G_r(k,t)$ is determined from the estimated noise spectrum and the (noisy) input audio signal. One aspect of the present invention is a post-processor 121 that carries out post-processing on the gains $G_r(k,t)$ to determine post-processed gains. Denote by $G(k,t)$ the result of post-processing the gains $G_r(k,t)$ determined by the input processing. The gains $G(k,t)$ are for applying to a frequency domain representation of the input audio signal or to a frequency domain representation of a function of a plurality of input audio signals for the case of more than one audio input signal.

In methods that do not include the post-processing of the present invention, applying the gain $G_r(k,t)$ to determine the noise-reduced signal $\hat{S}(k,t)$ can be performed in the frequency domain by a gain applier as follows:

$$\hat{S}(k,t)=G_r(k,t)D(k,t)$$

where k is the frequency bin index and t is the time index.

In an embodiment of the present invention, gain application module 131 accepts $G(k,t)$, the post-processed gains 125, and applies such gains to $D(k,t)$, the frequency domain representation of the input signal, to determine a noise-reduced signal $\hat{S}(k,t)$ 133.

$$\hat{S}(k,t)=G(k,t)D(k,t).$$

$\hat{S}(k,t)$, the processed data 133 may then be converted back to the sample domain by an output synthesis filterbank 135 to produce a frame of M signal samples 137. In some embodiments, in addition or instead, the signal 133 is subject to transformation or remapping, e.g., to a form ready for coding according to some coding method.

In some embodiments of the invention, different types of gain functions for determining the (raw) gain $G_r(k,t)$ can be used, such as spectral subtraction ("SS"), Wiener filtering, minimum mean squared error spectrum amplitude estimation (MMSE-SA), described in Y. Ephraim and D. Malah, "Speech enhancement using a minimum mean square error short-time spectral amplitude estimator," IEEE Trans. on Acoust., Speech, Signal Processing, vol. ASSP-32, pp. 1109-1121, December 1984, and minimum-mean-square-error log spectrum amplitude estimation (MMSE-LSA), first described in Y. Ephraim and D. Malah, "Speech enhancement using a minimum mean square error log-spectral amplitude estimator," IEEE Trans. on Acoust., Speech, Signal Processing, vol. ASSP-33, pp. 443-445, April 1985. Some such gain functions are summarized below together with the methods in which each gain function is used:

A) Power spectral subtraction:

$$G_{SS}(k,t) = \left(\frac{R_{PRIO}(k,t)}{1+R_{PRIO}(k,t)}\right)^{0.5},$$

where $$R_{PRIO}(k, t) = \frac{P_{\hat{S}}(k, t)}{P_N(k, t)}$$

denotes the a priori signal-to-noise ratio (SNR), with $P_{\hat{S}}(k,t)$, $P_N(k,t)$, and $P_D(k,t)$ denoting the estimated power spectra of a noise-reduced signal, an included noise signal, and the input audio signal, e.g., microphone signal, respectively.

Power spectral subtraction can be generalised to:

B) Generalized spectral subtraction:

$$G_{SS}(k, t) = \left(\frac{(R_{PRIO}(k, t))^\beta}{1 + (R_{PRIO}(k, t))^\beta}\right)^\alpha$$

where $\alpha$ and $\beta$ parameters.

C) Wiener filter:

$$G_{WIENER}(k, t) = \frac{R_{PRIO}(k, t)}{1 + R_{PRIO}(k, t)}$$

D) MMSE-SA:

$$G_{MMSE-LSA}(k, t) = \frac{\sqrt{\pi}}{2}\sqrt{\frac{R_{PRIO}(k, t)}{1 + R_{PRIO}(k, t)}}$$
$$\frac{1}{R_{POST}(k, t)} \cdot \times M\left[\frac{R_{PRIO}(k, t)}{1 + R_{PRIO}(k, t)}R_{POST}(k, t)\right],$$

where $M(x) = e^{-0.5x}[(1+x)I_0(0.5x) + xI_1(0.5x)]$, $$R_{POST}(k, t) = \frac{P_D(k, t)}{P_N(k, t)}$$

denotes a posteriori SNR, and $I_0$ and $I_1$ are the modified Bessel functions of zero and first order, respectively.

E) MMSE-LSA:

$$G_{MMSE-LSA}(k, t) = \frac{R_{PRIO}(k, t)}{1 + R_{PRIO}(k, t)}\exp\left(0.5\int_{v(k,t)}^{\infty}\frac{\exp-t'}{t'}dt'\right),$$

where $$v(k, t) = \frac{R_{PRIO}(k, t)}{1 + R_{PRIO}(k, t)}R_{POST}(k, t).$$

In the above definitions, the gain values for generating $\hat{S}(k,t)$ are typically in the range of [0, 1].

Due to non-stationarity of noise, estimation errors, and the general requirement that applying the gains actually remove undesired signal to isolate the desired signal, applying the raw gain $G_r(k,t)$ may produce various processing artifacts, such as speech distortion and musical noise in the enhanced signal. In particular, musical noise artifacts may be caused by estimation errors in the frequency domain which lead to spurious peaks in the spectral representation of the enhanced signal. When the enhanced signal is transformed back to the time domain, these peaks correspond to a tonal, e.g., sinusoidal excitation whose frequency varies randomly from frame to frame.

Embodiments of the present invention include methods to post-process the gain determined by input processing in order to determine post-processed gains for a set of frequency bins to apply to a signal.

While the above discussion is for an input processor that determines gains for noise reduction, e.g., using Wiener filtering, MMSE-SA, or MMSE-LSA, the invention is not limited to post-processing gains that are only for noise reduction. Post-processing methods and post-processors described in various embodiments of the present invention are applicable to gains determined not just for noise reduction, but also for noise reduction combined with reducing out-of-location signals when more than one microphone input is input to the input processing. The gain is then applicable to a derived, e.g., down-mixed version of the input signals. The gain smoothing post-processing methods described as embodiments of the present invention also are applicable to gains determined for a combination of noise reduction and echo suppression when one or more reference signals are available to estimate echo characteristics, e.g., using linear prediction. The gain smoothing post-processing methods described as embodiments of the present invention also are applicable for combined suppression of noise, echo, and out-of-location signals. Furthermore, while the gains are applied in the frequency bin domain, the input processing may determine gains for a set of frequency bands rather than frequency bins, with at least some of the frequency bands including more than one frequency bin. These banded gains are interpolated to frequency bins when applied to frequency bin data. Embodiments of the present invention also are applicable to such banded gains, and how to modify the description herein to accommodate banded gains would be straightforward and clear to those skilled in the art.

Figure 1B:
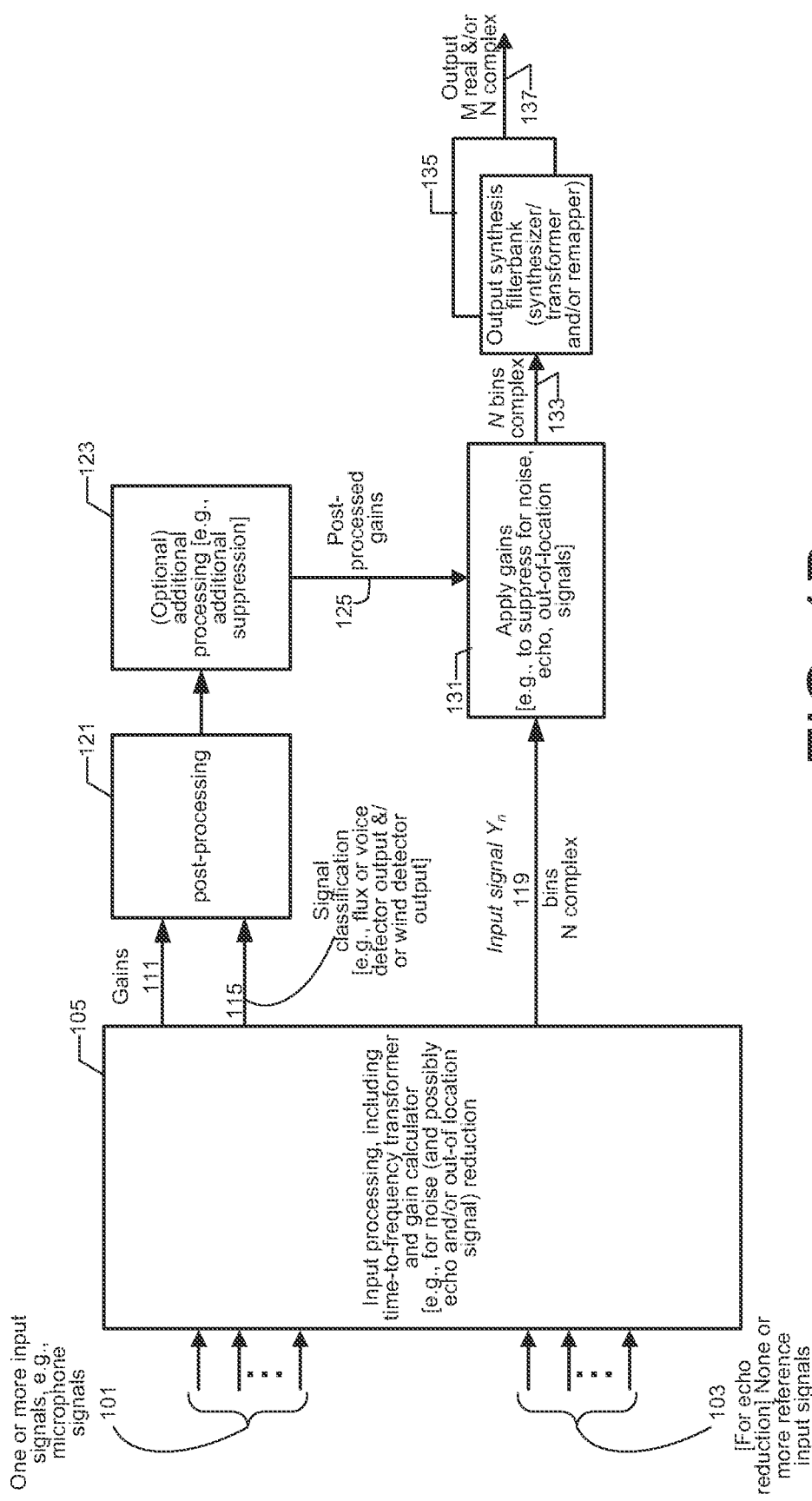
FIG. 1B shows a block diagram of one example embodiment of processing one or more input audio signals, e.g., signals from differently located microphones, with optional echo suppression, and including an embodiment of the present invention.

FIG. 1B shows one example of a more general system that can include out-of-location signal reduction for the case of multiple input signals, e.g., from differently located microphones, and that can include echo suppression for the case of one or more reference signals being input. The system of FIG. 1B includes an embodiment of the present invention, and is for processing one input audio signal 101, e.g., a microphone signal 101, or a plurality of input audio signals, e.g., microphone signals 101 from differently located microphones. The processing is by time frames of a number, e.g., M samples. Denote by an index t the time frame. In FIG. 1B there is a set of one or more, the number denoted P of inputs, e.g., microphone signals 101. An input processor 105 accepts sampled input audio signal(s) 101 and forms a banded instantaneous frequency domain amplitude metric 119 of the input audio signal(s) 101 for a plurality B of frequency bands. In some embodiments in which there is more than one input audio signal, the instantaneous amplitude metric 119 is mixed-down from the input audio signal. The amplitude metric represents the spectral content. In many of the embodiments described herein, the spectral content is in terms of the power spectrum. However, the invention is not limited to processing power spectral values. Rather, any spectral amplitude dependent metric can be used. For example, if the amplitude spectrum is used directly, such spectral content is sometimes referred to as spectral envelope. Thus, the phrase "power (or other amplitude metric) spectrum" is sometimes used in the description.

In one noise reduction embodiment, the input processor 105 determines a set of gains 111 to apply to the instantaneous amplitude metric 119. In one embodiment the input processing further includes determining a signal classification of the input audio signal(s), e.g., an indication of whether the input audio signal(s) is/are likely to be voice or not as determined by a voice activity detector (VAD), and/or an indication of whether the input audio signal(s) is/are likely to be wind or not as determined by a wind activity detector (WAD), and/or an indication that the signal energy is rapidly changing as indicated, e.g., by the spectral flux exceeding a threshold.

A feature of embodiments of the present invention includes post-processing the gains to improve the quality of the output. The post-processing produces post-processed gains 125 that are applied to the instantaneous power (or other amplitude metric) 119 to produce output, e.g., as a plurality of processed frequency bins 133, or that are applied to a transformed input. An output synthesis filterbank 135 (or for subsequent coding, a transformer/remapper) converts these frequency bins to desired output 137.

Input processing element 105 includes an input analysis filterbank, and a gain calculator. The input analysis filterbank, for the case of one input audio signal 101, includes a transformer to transform the samples of a frame into frequency bins. Some embodiments of the present invention include a banding element to form frequency bands, most of which include a plurality of frequency bins. The input analysis filterbank, for the case of a plurality of input audio signals 101, includes a transformer to transform the samples of a frame of each of the input audio signals into frequency bins, a downmixer, e.g., a beamformer to downmix the plurality of signals into a single signal, and a banding element to form frequency bands, most of which include a plurality of frequency bins.

In one embodiment, the B bands are at frequencies whose spacing is monotonically non-decreasing. A reasonable number, e.g., 90% of the frequency bands include contribution from more than one frequency bin, and in particular embodiments, each frequency band includes contribution from two or more frequency bins. In some embodiments, the bands are monotonically increasing in a logarithmic-like manner. In some embodiments, the bands are on a psycho-acoustic scale, that is, the frequency bands are spaced with a scaling related to psycho-acoustic critical spacing, such banding called "perceptually-spaced banding" herein. In particular embodiments, the band spacing is around 1 ERB or 0.5 Bark, or equivalent bands with frequency separation at around 10% of the center frequency. A reasonable range of frequency spacing is from 5-20% or approximately 0.5 to 2 ERB.

In some embodiments in which the input processing includes noise reduction, the input processing also includes echo reduction. One example of input processing that includes echo reduction is described in commonly owned International Application No. PCT/US2012/024370 having international filing date 8 Feb. 2012 titled "COMBINED SUPPRESSION OF NOISE, ECHO, AND OUT-OF-LOCATION SIGNALS," published as WO2012109384, the contents of which are hereby incorporated by reference. For those embodiments in which the input processing includes echo reduction, one or more reference signals also are included and used to obtain an estimate of some property of the echo, e.g., of the power (or other amplitude metric) spectrum of the echo. The resulting banded gains achieve simultaneous echo reduction and noise reduction.

In some embodiments that include noise reduction and echo reduction, the post-processed gains are accepted by an element 123 that modifies the gains to include additional echo suppression. The result is a set of post-processed gains 125 that are used to process the input audio signal in the frequency domain, e.g., as frequency bins, after downmixing if there are more than one input audio signals, e.g., from differently located microphones.

In one embodiment, the banded gains are interpolated and applied to the frequency bin data of the input audio signal (if there is only one input audio signal) or the downmixed input audio signal (if there is more than one input audio signal), denoted $\tilde{S}(k,t)$, n=0, 1, . . . , N−1, where N is the number of frequency bins. $Y_n$, n=0, 1, . . . , N−1 are the frequency bins of a frame of input audio signal samples $Y_m$, m=1, M. The processed data 133 may then be converted back to the sample domain by an output synthesis filterbank 135 to produce a frame of M signal samples 137. In some embodiments, in addition or instead, the signal 133 is subject to transformation or remapping, e.g., to a form ready for coding according to some coding method.

An Example Acoustic Noise Reduction System

An acoustic noise reduction system typically includes a noise estimator and a gain calculation module to determine a set of noise reduction gains that are determined, for example, on a set of frequency bands, and applied to the (noisy) input audio signal after transformation to the frequency domain and banding to the set of frequency bands to attenuate noise components. The acoustic noise reduction system may include one microphone, or a plurality of inputs from differently located microphones and downmixing, e.g., beamforming to generate one input audio signal. The acoustic noise reduction system may further include echo reduction, and may further include out-of-location signal reduction.

Figure 2:
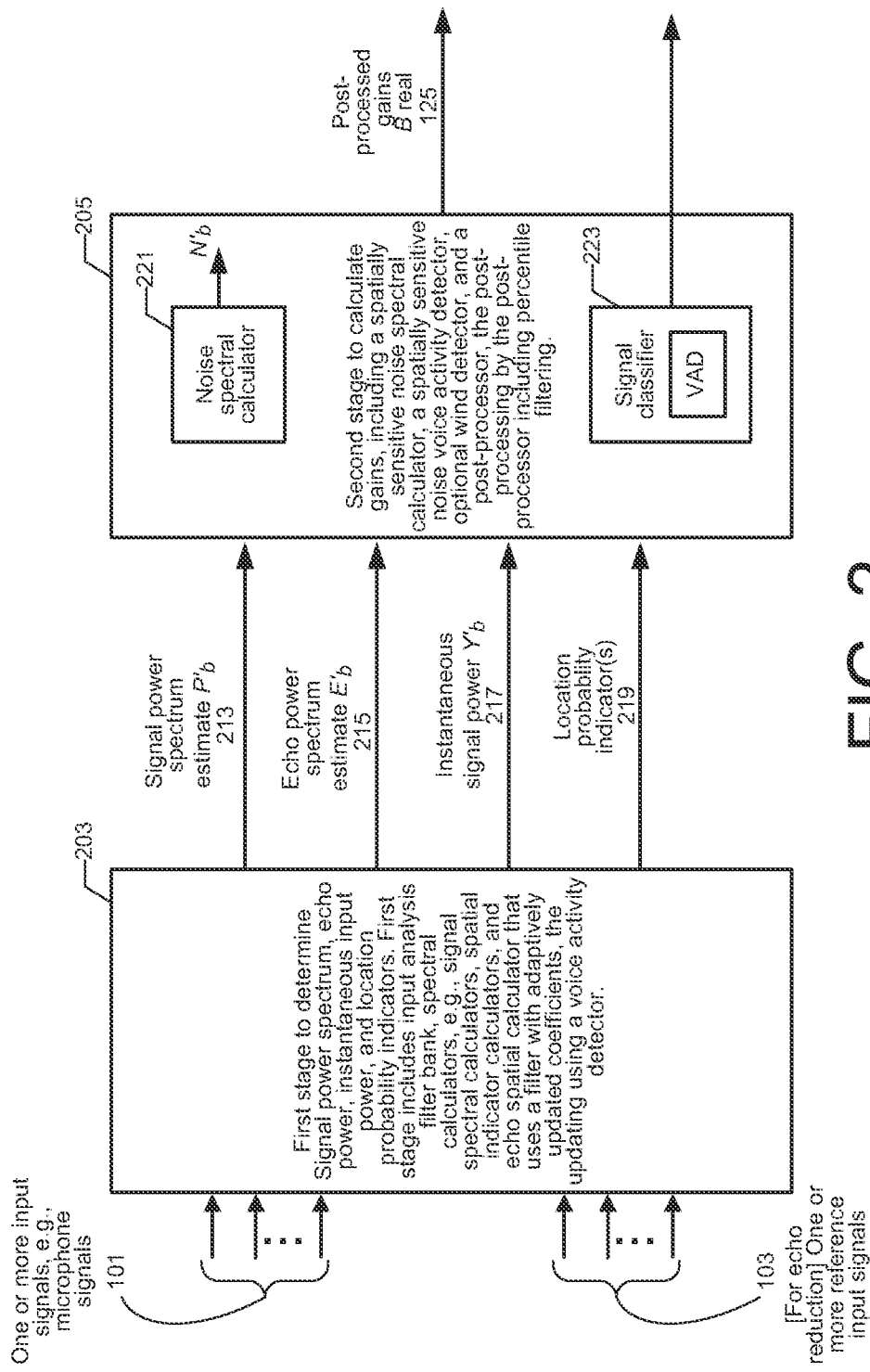
FIG. 2 shows a block diagram of one example of input processing to determine a set of banded gains which may be subject to post-processing according to an embodiment of the present invention.

FIG. 2 shows one example of an apparatus configured to determine a set of post-processed gains for suppression of noise, and in some versions, simultaneous echo suppression, and in some versions, simultaneous suppression of out-of-location signals. Such a system is described, e.g., in PCT/2012/024370. The inputs include a set of one or more input audio signals 201, e.g., signals from differently located microphones, each in sets of M samples per frame. When spatial information is included, there are two or more input audio signals, e.g., signals from spatially separated microphones. When echo suppression is included, one or more reference signals 103 are also accepted, e.g., in frames of M samples. These may be, for example, one or more signals from one or more loudspeakers, or, in another embodiment, the signal(s) that are used to drive the loudspeaker(s). A first input processing stage 203 determines a banded signal power (or other amplitude metric) spectrum 213 denoted $P'_b$, and a banded measure of the instantaneous power 217 denoted $Y'_b$. When more than one input audio signal is included, each of the spectrum 213 and instantaneous banded measure 217 is of the inputs after being mixed down by a downmixer, e.g., a beamformer. When echo suppression is included, the first input processing stage 203 also determines a banded power spectrum estimate of the echo 215, denoted $E'_b$, the determining being from a previously calculated power spectrum estimate of the echo using a filter with a set of adaptively determined filter coefficients. In those versions that include out-of-location signal suppression, the first input processing stage 203 also determines spatial features 219 in the form of banded location probability indicators 219 that are usable to spatially separate a signal into the components originating from the desired location and those not from the desired direction.

The quantities from the first stage 203 are used in a second stage 205 that determines gains, and that post-processes the gains, including an embodiment of the present invention, to determine the banded post-processed gains 125. Embodiments of the second stage 205 include a noise power (or other amplitude metric) spectrum calculator 221 to determine a measure of the noise power (or other amplitude metric) spectrum, denoted $E'_b$, and a signal classifier 223 to determine a signal classification 115, e.g., one or more of a voice activity detector (VAD), a wind activity detector, and a power flux calculator. FIG. 2 shows the signal classifier 223 including a VAD.

The invention, of course, is not limited to post-processing gains for noise reduction or for post-processing gains determined by the input processing and gain calculation described in PCT/2012/024370.

While in one embodiment the input processing is to reduce noise (and possibly echo and out-of-location signals), in other embodiments, the input processing may be, additionally or primarily, to determine banded gains to carry out one or more of perceptual domain-based leveling, perceptual domain-based dynamic range control, and perceptual domain-based dynamic equalization that take into account the variation in the perception of audio depending on the reproduction level of the audio signal, as described, for example, in commonly owned WO 2004111994 titled "METHOD, APPARATUS AND COMPUTER PROGRAM FOR CALCULATING AND ADJUSTING THE PERCEIVED LOUDNESS OF AN AUDIO SIGNAL." The banded gains calculated per WO 2004111994 are post-processed, as described herein to determine post-processed gains 125 to apply to the (transformed) input.

Post-Processing for Gain Smoothing

Musical noise artifacts may be caused by estimation errors that lead to spurious peaks in the spectrum of the enhanced signal. Rephrasing this in terms of gains, we may argue that musical noise artifacts may result from increased gain fluctuations that form peaks or holes in the spectrum of the processed signal. For a quasi-stationary noise floor, such gain variations damage the original perceptual temporal continuity, and thus lead to an unpleasant listening experience. To address this issue, it is evident that the variance of the gains should be made proportional to that of the noise. To do this, embodiments of the present invention include post-processing the gain by a post-processor to carry out gain smoothing.

One or Both of Delta Gain Smoothing and Decision-Directed Gain Smoothing.

Recall that the unsmoothed instantaneous gain determined by input processing a frame of samples of one or more input audio signals is denoted by $G_r(k,t)$, the frame is denoted by index t, and that the frequency bin is denoted by k. For simplicity of notation, we henceforth drop the frequency bin index k. Those of ordinary skill in the art would understand that $G_r(t)$ is actually $G_r(k,t)$, and that a post-processed gain $G(t)$ is actually $G(k,t)$, each of these gains being a function of the time index t and frequency bin k.

In different versions of the input processing, the gain $G_r(k,t)$ can be derived by using Wiener filtering, MMSE-SA, MMSE-LSA, a different noise suppression gain, or a combination of more than one gain function, including one or more of noise suppression, echo suppression, and out-of-location suppression.

Figure 10:
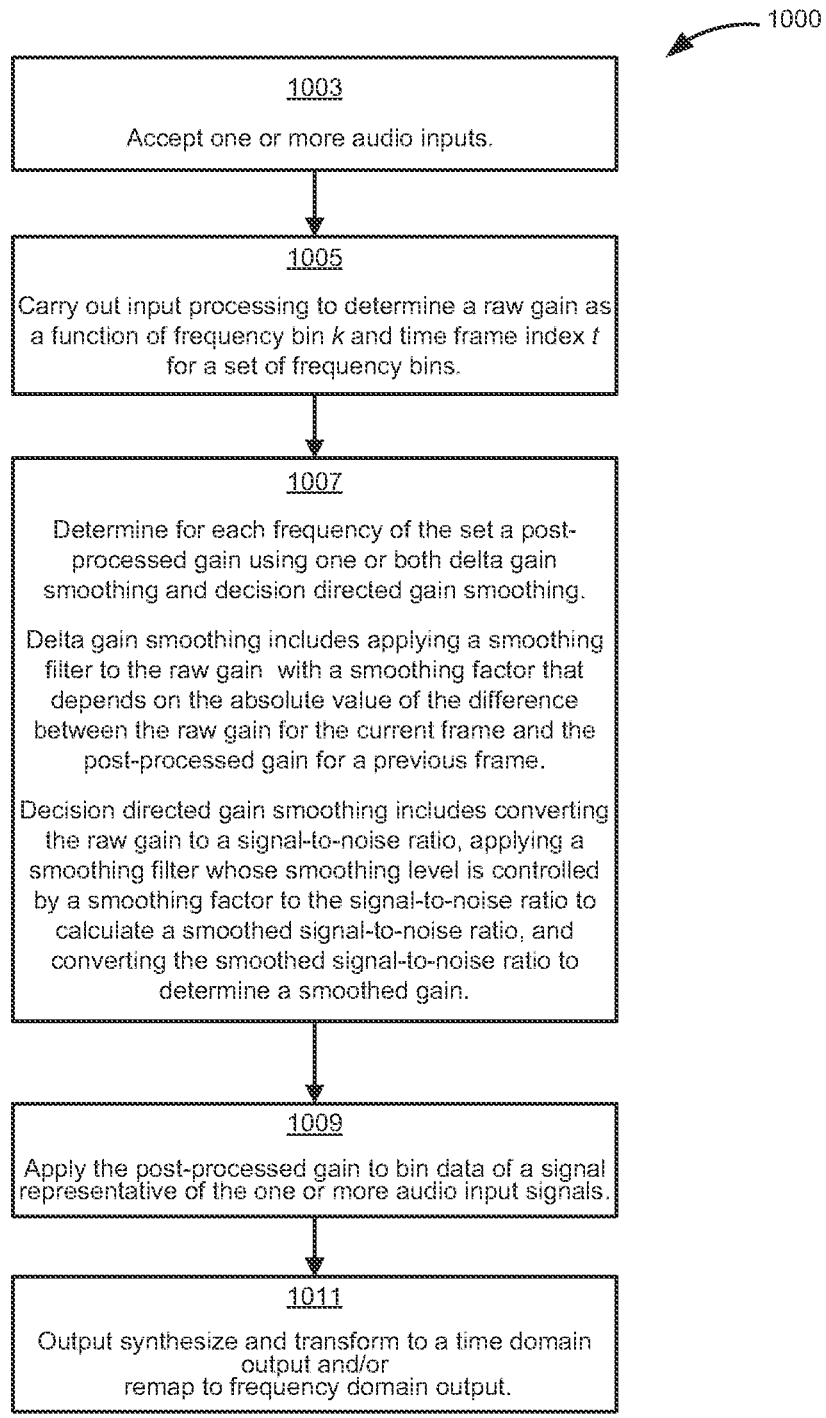
FIG. 10 shows a simplified flowchart of one method embodiment of the present invention.

FIG. 10 shows a simplified flowchart of one method embodiment 1000 of the present invention. The method is of operating a processing apparatus and includes in 1003 accepting in the processing apparatus one or more audio inputs, and in 1005 carrying out input processing to determine a raw gain, e.g., a raw gain denoted raw gain $G_r(k,t)$ as a function of frequency bin k and time frame index t for a set of frequency bins. Embodiments of the present invention include in 1007 determining for each frequency bin of a set of frequency bins a post-processed gain using one or both of delta gain smoothing and decision-directed gain smoothing, where delta gain smoothing includes applying a smoothing filter to the raw gain $G_r(k,t)$ with a smoothing factor that depends on the absolute value of the difference between the raw gain for the current frame and the post-processed gain for a previous frame, and wherein decision-directed gain smoothing includes converting the raw gain to a signal-to-noise ratio, applying a smoothing filter whose smoothing level is controlled by a smoothing factor to the signal-to-noise ratio to calculate a smoothed signal-to-noise ratio, and converting the smoothed signal-to-noise ratio to determine a smoothed gain as the post-processed gain.

The method includes in 1009 applying the post-processed gain to bin data of a signal representative of the one or more audio input signals. The method further includes in 1011, output synthesizing and transforming to a time domain output and/or remapping to frequency domain output.

Delta Gain Smoothing

Assuming a low-varying noise floor, a central idea of delta gain smoothing is using the gain differential (called "delta" or "gain delta") to regulate the amount of smoothing of the raw gain.

One possible gain smoothing method is applying a first order linear smoothing filter which post-processes the gain to determine $G(t)$ according to:

$$G(t)=G(t-1)+\alpha_g(t)(G_r(t)-G(t-1)),$$

where $\alpha_g(t)$ is a smoothing factor with values between 0 and 1 that controls the degree of smoothing. A smaller $\alpha_g(t)$ results in greater smoothing. To determine a suitable smoothing parameter, suppose one desires a smoothing time duration of $T_S$. Suppose the frame interval is T. Then one sets $\alpha_g(t)=1-\exp[-1/(T_S/T)]$. As an example, suppose $T_S$ is 0.2 s, and the frame interval T is 16 ms=0.016 s, then $\alpha_g(t)=0.0796$. In general, for gains, $\alpha_g(t)\geq 0.5$.

In practice such a simple linear smoothing approach can remove some musical noise but may lead to speech distortion, ambient sounds, and echoic artifacts. One embodiment of the invention adds a gain delta term as follows:

$$G(t)=G(t-1)+\alpha_g(t)|G_r(t)-G(t-1)|^\beta(G_r(t)-G(t-1)), \quad (1)$$

where $\beta$ is a positive valued parameter. In one embodiment, $\beta=1$, so that the filter is a first order smoothing filter whose smoothing factor is a function of the gain delta. In the more general case, since the effective smoothing factor is now $\alpha_g(t)|G_r(t)-G(t-1)|^\beta$, $\alpha_g(t)$ is no longer restricted be in the range of [0, 1]. Rather, $$0\leq\alpha_g(t)|G_r(t)-G(t-1)|^\beta\leq 1. \quad (2)$$

In practice, $\alpha_g(t)$ can be fixed, e.g., 1, and different values of $\beta$ are used. In one embodiment, $\beta=1$. In another embodiment, $\beta=0.5$, and in yet another embodiment, $\beta=2$.

It can be seen that with delta smoothing, the gains are more aggressively smoothed when the gain delta—the absolute value of the difference between the current raw gain and the previous post-processed gain—is small. On the other hand, a larger gain delta leads to less smoothing, which is especially desirable for voice quality preservation during speech onsets and for avoiding elevated noise floor during speech offsets.

Figure 3A:
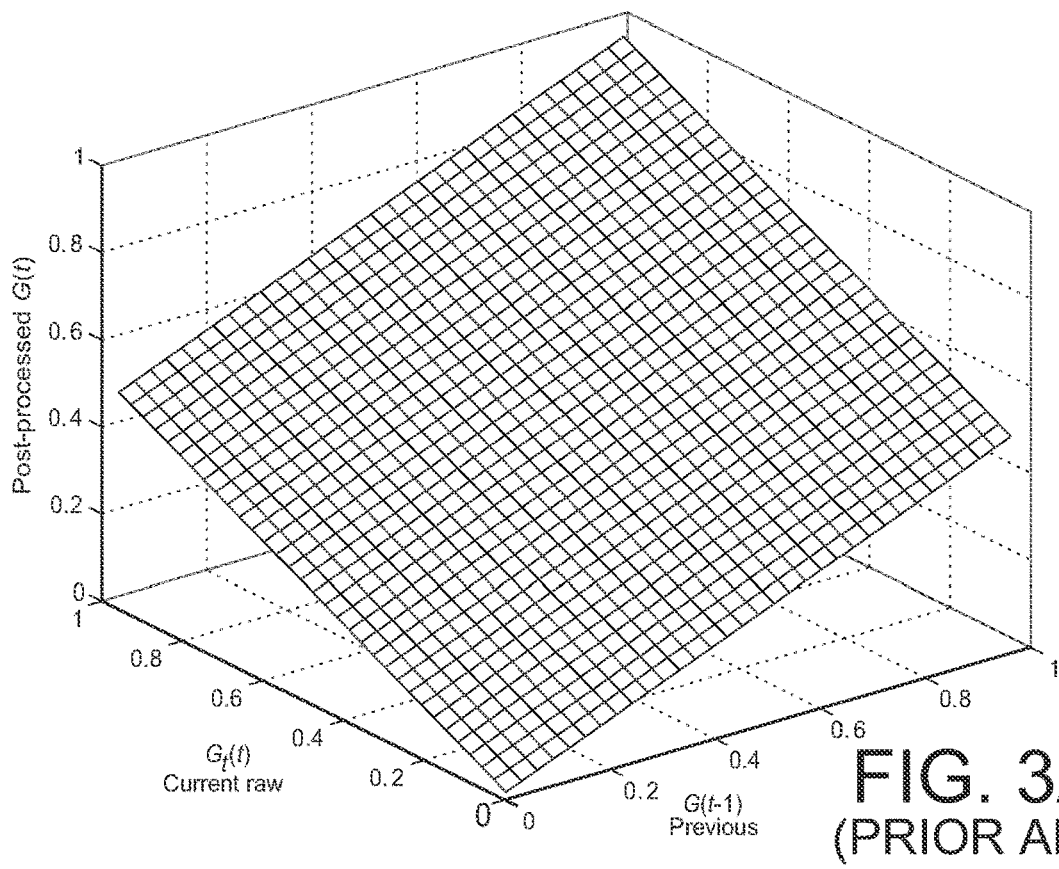
FIGS. 3A and 3B show a surface plot and several 2D plots of the post-processed gain that results by simple linear gain smoothing.
Figure 3B:
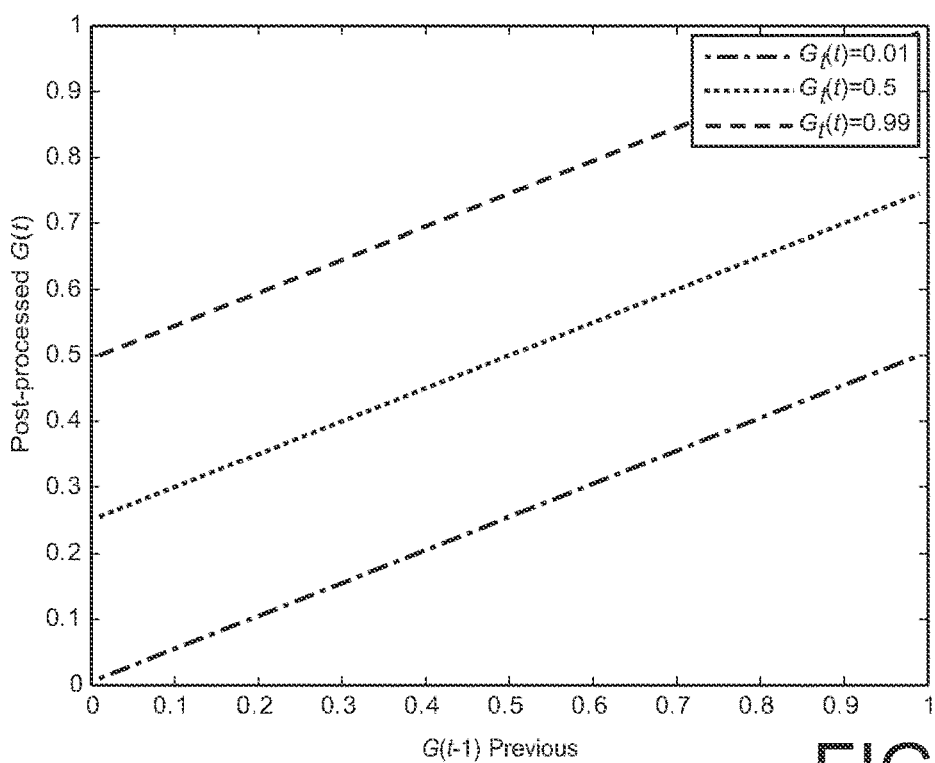
Figure 4A:
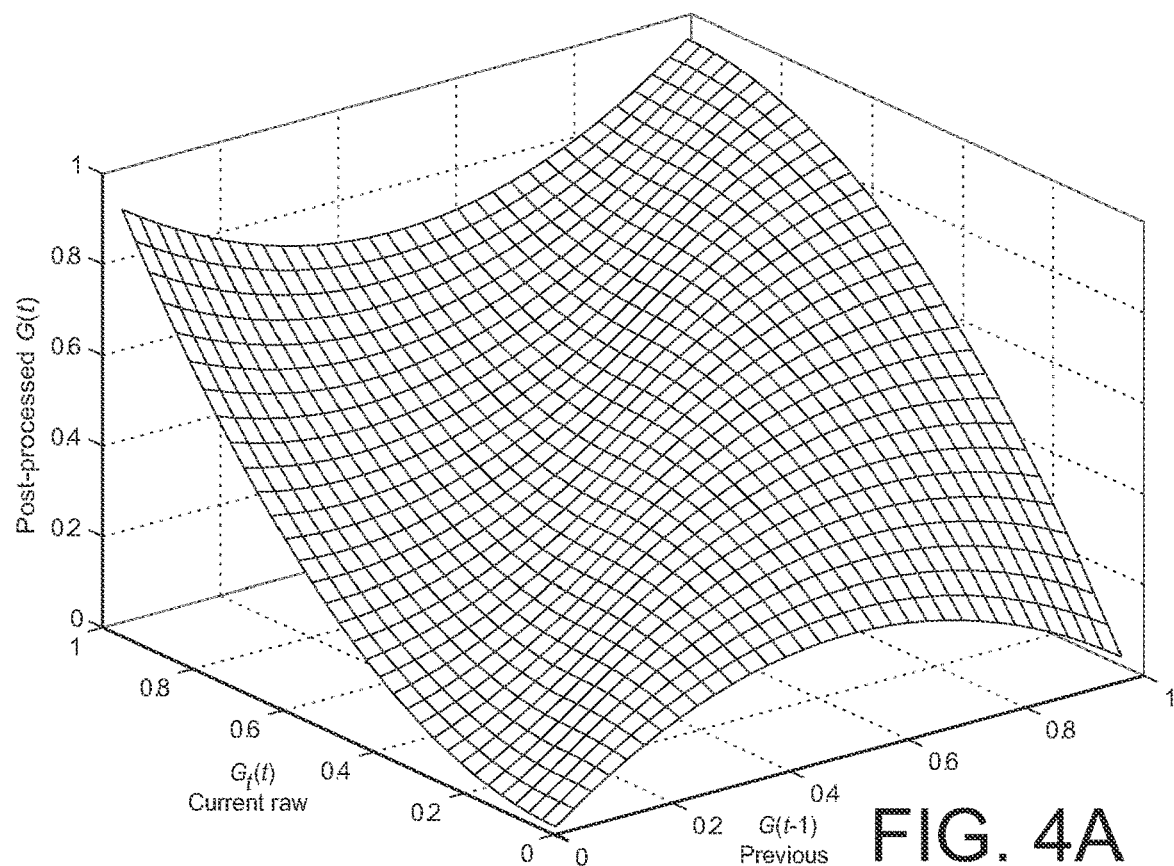
FIGS. 4A and 4B show a surface plot and several 2D plots of the post-processed gain that results by applying a delta gain smoothing method of an embodiment of the invention.
Figure 4B:
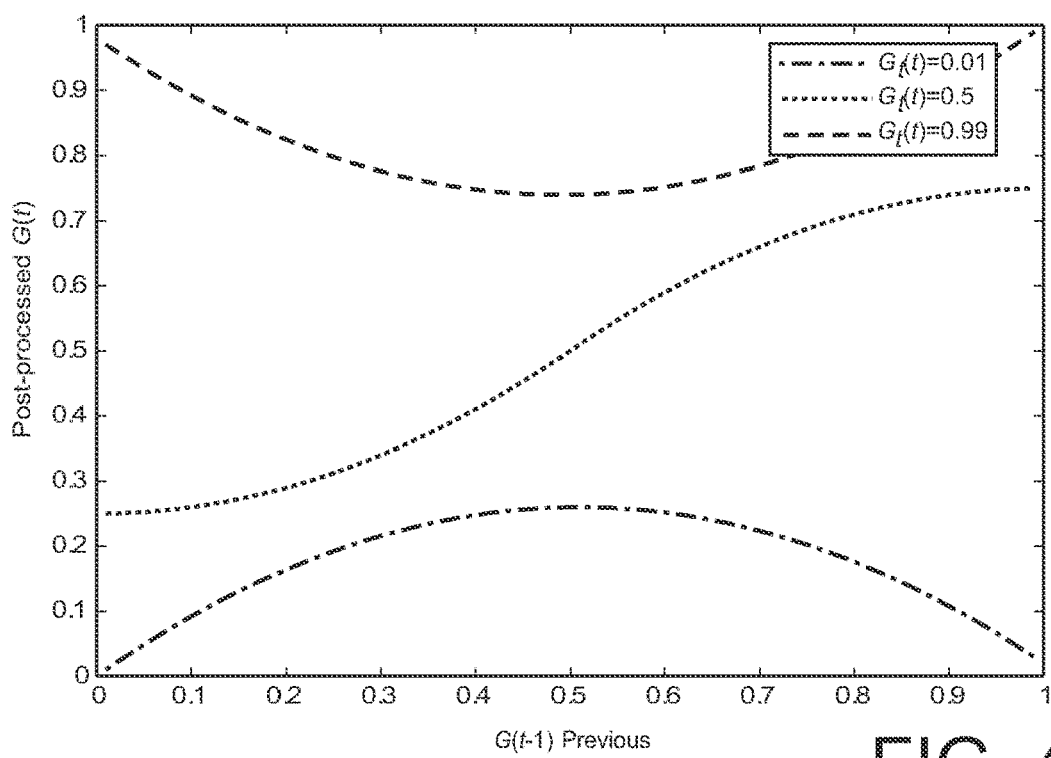

FIGS. 3A and 3B show a plot $G(t)$ vs. both $G_r(t)$ and $G(t-1)$ and a plot of $G(t)$ vs. $G(t-1)$ for simple linear gain smoothing. FIGS. 4A and 4B show a plot $G(t)$ vs. both $G_r(t)$ and G(t−1) and a plot of G(t) vs. G(t−1) for a delta gain smoothing embodiment of the present invention. For these, and all other examples described herein, the input audio signal was sampled at 16 kHz. The DFT was taken over a window of width 32 ms, that is, 512 samples. Each frame has 50% overlap, so that the frame interval, i.e., the time index unit corresponds to 16 ms. Of course, one may implement the methods described herein with other sampling rates, e.g., 8 kHz for speech, or 32 kHz, etc., and one also may use different time windows and frame intervals, e.g., 20 ms and 10 ms, respectively.

For the linear gain smoothing of FIGS. 3A and 3B, $\alpha_g(t)=0.5$, while for delta gain smoothing results of FIGS. 4A and 4B, $\alpha_g(t)=1$ and, $=1$. When different sampling rates are used, the parameter values may need to be adjusted.

Consider, as an example, the onset of speech where $G_r(t)=0.99$ and $G(t-1)=0.1$. Delta gain smoothing according to an embodiment of the invention produces a desired high gain value of $G(t)=0.97$ whereas linear gain smoothing generates $G(t)=0.5$. For speech offset, suppose $G_r(t)=0.01$ and $G(t-1)=0.99$, in which case the final gains from delta smoothing and linear smoothing are $G(t)=0.03$ and $G(t)=0.5$, respectively. The smaller gain from delta smoothing is preferred here since a higher value would result in an elevated noise floor immediately after the speech segment. When the difference between $G_r(t)$ and $G(t-1)$ becomes small, the smoothed gain $G(t)$ is approximately the average of $G_r(t)$ and $G(t-1)$ for delta smoothing, which is similar to that of the linear gain smoothing. It could be argued that the aforementioned speech onset and offset problems could simply be solved by using a larger $\alpha_g(t)$ in the linear smoothing equation. Unfortunately, this will lead to less effective smoothing. Thus it is evident that with heuristic tuning of $\alpha_g(t)$ using linear smoothing, it may be difficult to achieve overall optimal performance.

While one embodiment uses the delta smoothing post-processing described by Eq. 1, alternative embodiments use variants of the delta smoothing post-processing. In some embodiments, the smoothing factor for the delta gain smoothing depends on signal classification, e.g., on whether the input is likely to be voice. One alternate embodiment takes into account that during speech, it may be desirable to preserve voice quality. One way of determining whether the input is likely to be voice is ascertaining whether the gain is above a pre-defined threshold. One such embodiment includes disabling smoothing when the gains are above a pre-defined threshold. In one example, $$G(t) = \begin{cases} G(t-1) + \alpha_g(t) \, |G_r(t) - G(t-1)|^\beta \\ \quad G_r(t) - G(t-1)) & \text{if } G_r(t) \leq Th \\ G_r(t) & \text{otherwise} \end{cases} \quad (3)$$

where Th is a pre-defined threshold between 0 and 1. In one embodiment, a value of Th=0.4 is used. In general, a higher Th will let more gains slip through the smoothing process, with the smoothing being more aggressive. Other reasonable values of Th could be 0.5, 0.6, and so forth.

Another way of determining whether the input is likely to be voice is ascertaining whether the gain delta is above a pre-defined threshold. One such embodiment includes disabling smoothing when the gain deltas are large. In one example, $$G(t) = \begin{cases} G(t-1) + \alpha_g(t) \, |G_r(t) - G(t-1)|^\beta \\ \quad G_r(t) - G(t-1)) & \text{if } |G_r(t) - G(t-1)|^\beta \leq Th \\ G_r(t) & \text{otherwise} \end{cases} \quad (4)$$

Again, Th is a pre-defined threshold between 0 and 1. In one embodiment, a value of Th=0.4 is used. In general, a higher Th will let more gains slip through the smoothing process, with the smoothing being more aggressive. Other reasonable values of Th could be 0.5, 0.6, and so forth.

Another way of determining whether the input is likely to be voice is to use a voice activity detector (VAD) or voice activity detection method. In yet another embodiment, a VAD or voice activity detection method is used, and the smoothing is controlled according to the output of the VAD. Thus, $$G(t) = \quad (5)$$
$$\begin{cases} G(t-1) + \alpha_g(t)|G_r(t) - G(t-1)|^\beta (G_r(t) - G(t-1)) & \text{if no voice} \\ G_r(t) & \text{otherwise} \end{cases}.$$

In another embodiment in which a VAD is used, one embodiment uses less aggressive smoothing during voice activity as detected by the VAD, e.g., delta smoothing with $\alpha_g(t)=1$ and $\beta=0.5$, and more aggressive smoothing when the VAD indicates no voice, e.g., $\alpha_g(t)=1$ and $\beta=2$.

Embodiments of the invention are not limited to any particular type of voice activity diction method or VAD, and many VADs are known in the art, and would be familiar to those skilled in the art.

According to yet another embodiment, additionally or instead, the method includes smoothing the gain only when there is a predefined gain change direction. For example, the method includes smoothing the gain only when there is a gain increase. In one such example:

$$G(t) = \begin{cases} G(t-1) + \alpha_g(t)|G_r(t) - G(t-1)|^\beta (G_r(t) - \\ \quad G(t-1)) & \text{if } G_r(t) > G(t-1) \\ G_r(t) & \text{otherwise} \end{cases} \quad (6)$$

As another example, the method includes smoothing the gain only when there is a gain decrease, e.g.:

$$G(t) = \begin{cases} G(t-1) + \alpha_g(t)|G_r(t) - G(t-1)|^\beta (G_r(t) - \\ \quad G(t-1)) & \text{if } G_r(t) < G(t-1) \\ G_r(t) & \text{otherwise} \end{cases} \quad (7)$$

In one embodiment, carrying out the smoothing only when the gain increases (Eq. 6) is used when the input is expected to not include voice, and carrying out the smoothing only when the gain increases (Eq. 7) is used when the input is expected to include voice. Furthermore, this is combined with using a different value for $\alpha_g(t)$ for values of t corresponding to the unvoiced portions of input (Eq. 6) than the value for $\alpha_g(t)$ for values of t corresponding to the voiced portions of input (Eq. 7).

In yet another embodiment, the smoothed gain and raw gain are combined. This is appropriate, for example, if the delta smoothing is deemed too aggressive. Evaluating whether or not the smoothing is too aggressive can be according to such measures as Perceptual Evaluation of Speech Quality (PESQ), speech distortion, signal-to-noise ratio improvement (SNRI), and so forth. In one embodiment, a simple combination of raw gains and smoothed gains is used rather than an assessment of aggressiveness.

In one version, the final gain to use, denoted G(k,t), is $$G(t) = \alpha G_{SMOOTH}(t) + (1-\alpha) G_r(t),$$

where $G_{SMOOTH}(t)$ is as determined by a delta gain smoothing method as described by one of Eqs. 1 to 7 above. In one version, a value of $\alpha$ is 0.5 is used. A reasonable range of values for $\alpha$ is between 0.4 and 0.9.

In the above versions of delta gain smoothing, the smoothing was only temporal. Other embodiments include frequency dependent gain smoothing. One such set of embodiments of delta gain smoothing include making the smoothing factor a function of the frequency bin k. For example, the smoothing factor $\alpha_g(t)$ can be made frequency dependent with pre-defined values that yield different amount of smoothing for different frequencies. One example embodiment uses the following variation of frequency. For this, the frequency bin k, k=0, ..., N−1. is included in the notation:

Denote $$\alpha_{fd}(k, t) = \frac{k+1}{k + |G_r(k, t) - G(k, t-1)|^{-\beta}}. \quad (8)$$

Then, for one version of frequency dependent delta smoothing, $$G(k,t) = G(k,t-1) + \alpha_g(t)\alpha_{fd}(k,t)(G_r(k,t) - G(k,t-1)) \quad (9)$$

With this formulation, $\alpha_{fd}(k,t)$ is equal to $|G_r(k,t) - G(k,t-1)|^\beta$ for the lowest frequency bin, i.e. k=0, whereas as frequency bin k becomes larger, the contribution of the delta term $|G_r(k,t) - G(k,t-1)|^\beta$ diminishes, and eventually $\alpha_{fd}(k,t)$ becomes 1 or very close thereto.

Alternate embodiments use different frequency dependent smoothing factors $\alpha_{fd}(k,t)$ that have the property that for the lowest k, $\alpha_{fd}(k,t)$ is equal to $|G_r(k,t) - G(k,t-1)|^\beta$ and as frequency bin k becomes larger, eventually $\alpha_{fd}(k,t)$ becomes 1 or very close thereto.

The delta gain smoothing methods described in the various delta gain smoothing embodiments of the present invention are applicable to gains determined not just for noise reduction, but also for noise reduction combined with reducing out-of-location signals when more than one microphone input is input to the input processing. The gain is then applicable to a down-mixed version of the input signals. The delta gain smoothing methods described in the various delta gain smoothing embodiments of the present invention are applicable to gains determined for a combination of noise reduction and echo suppression when one or more reference signals are available to estimate echo characteristics, e.g., using linear prediction. The delta gain smoothing methods described in the various delta gain smoothing embodiments also are applicable for combined suppression of noise, echo, and out-of-location signals.

Decision-Directed Gain Smoothing Combined with Delta Gain Smoothing

Some embodiments of the present invention include decision-directed gain smoothing that comprises converting the raw gain to a signal-to-noise ratio, applying a smoothing filter whose smoothing level is controlled by a smoothing factor to the signal-to-noise ratio to calculate a smoothed signal-to-noise ratio, and converting the smoothed signal-to-noise ratio to determine a smoothed gain.

In particular, decision-directed includes calculating a raw a posteriori SNR from the raw gain $G_r(t)$ determined for the current frame and a previous frame a SNR from the post-processed gain for the previous frame. In one embodiment, the signal-to-noise ratios are determined using a Wiener filter relationship as:

$$R_{POST}(t) = \frac{G_r(t)}{1 - G_r(t)} \text{ and } R_{PRIO}(t-1) = \frac{G(t-1)}{1 - G(t-1)}, \quad (10)$$

where again, for simplicity of notation, the frequency bin k dependence is omitted in the notation, but would be understood by one skilled in the art to exist.

One embodiment of decision-directed gain smoothing further comprises applying a smoothing filter to the SNR to determine a smoothed SNR. In one embodiment, the smoothing filter for smoothing the SNR is defined by $$\hat{R}_{PRIO}(k, t) = \frac{G(k, t-1)}{1 - G(k, t-1)} + \alpha\left(\frac{G_r(k, t)}{1 - G_r(k, t)} - \frac{G(k, t-1)}{1 - G(k, t-1)}\right), \quad (11)$$

where $\hat{R}_{PRIO}(k,t)$ is the smoothed SNR, and $\alpha$ is a smoothing factor.

The method further includes converting the smoothed a priori SNR for the current gain to a smoothed gain. In one embodiment, $$G(t) = \frac{\hat{R}_{PRIO}(t)}{1 + \hat{R}_{PRIO}(t)}. \quad (12)$$

Figure 5A:
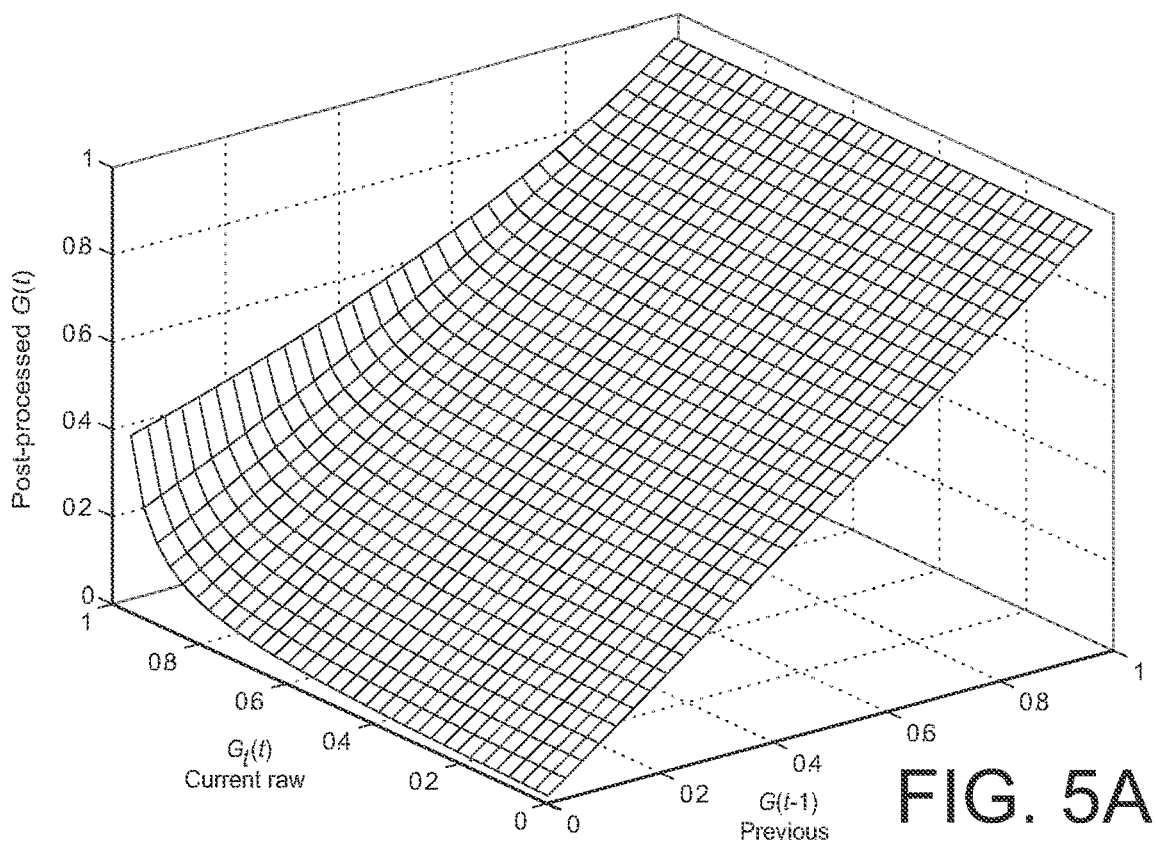
FIGS. 5A and 5B, 6A and 6B, and 7A and 7B show surface plots and several 2D plots of the post-processed gain that results by a version of decision-directed gain smoothing with different parameter values.
Figure 5B:
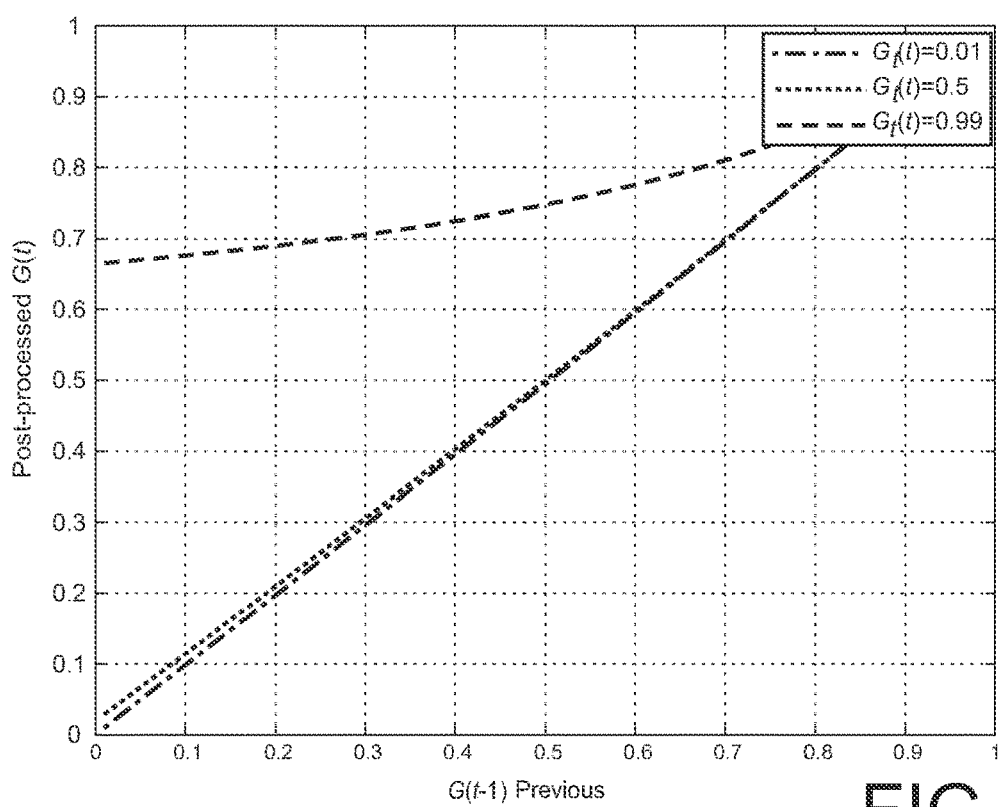
Figure 6A:
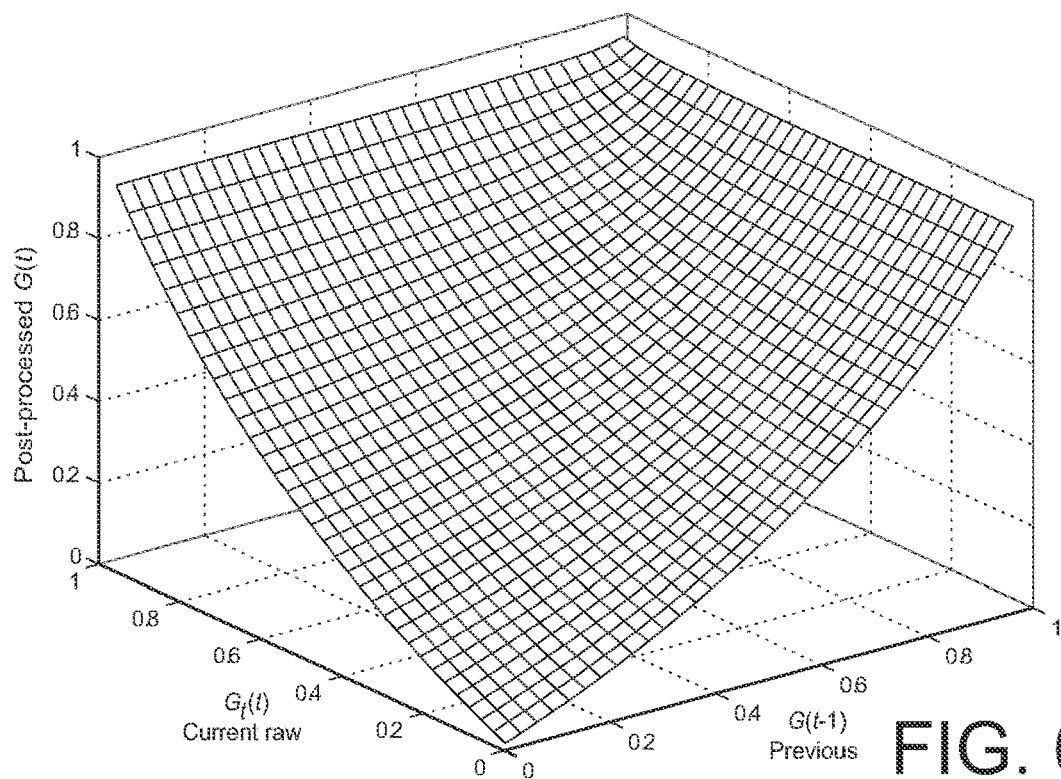
Figure 6B:
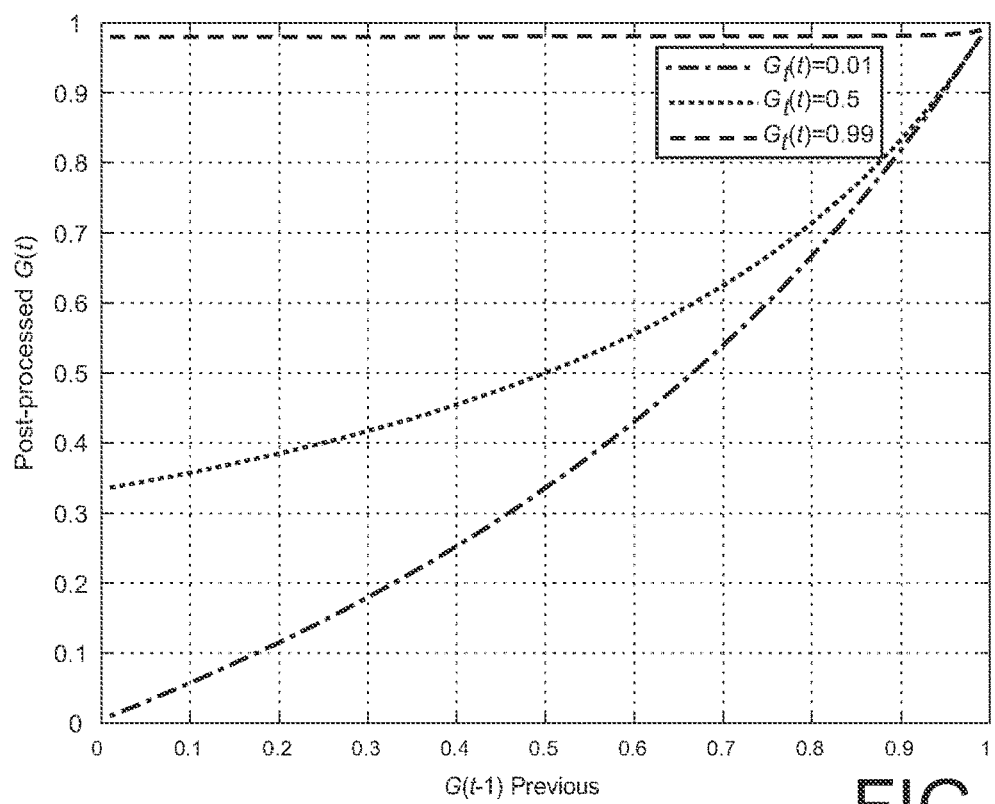
Figure 7A:
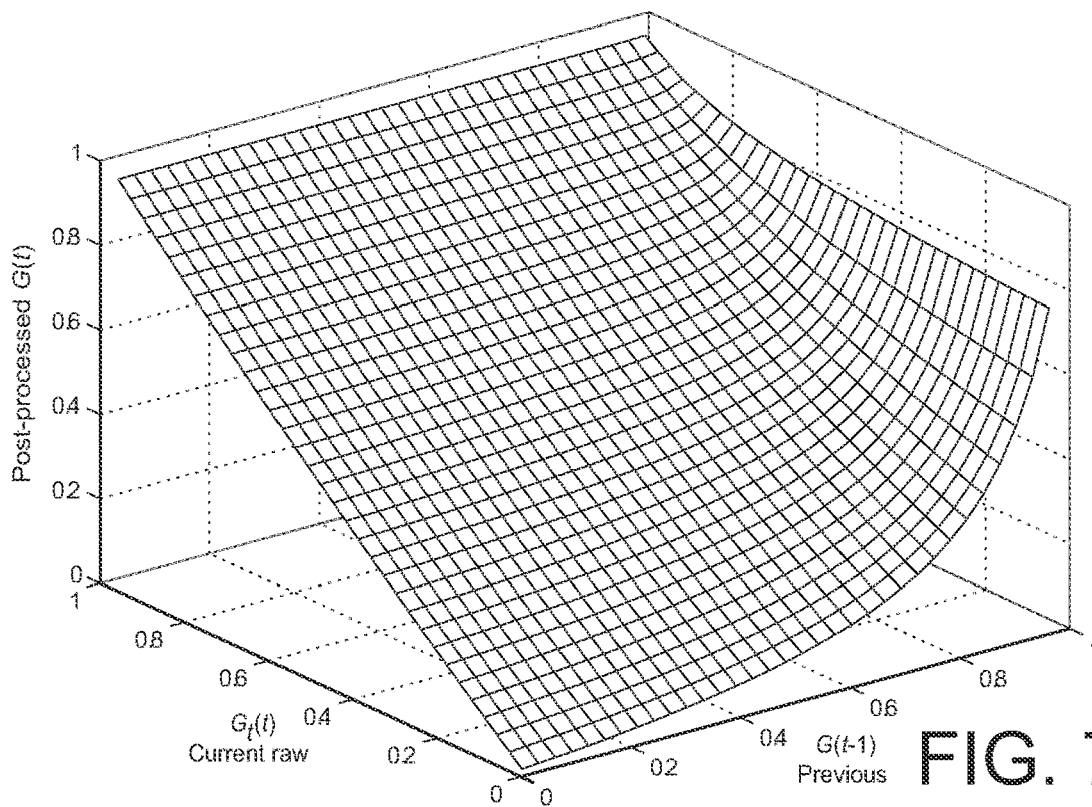
Figure 7B:
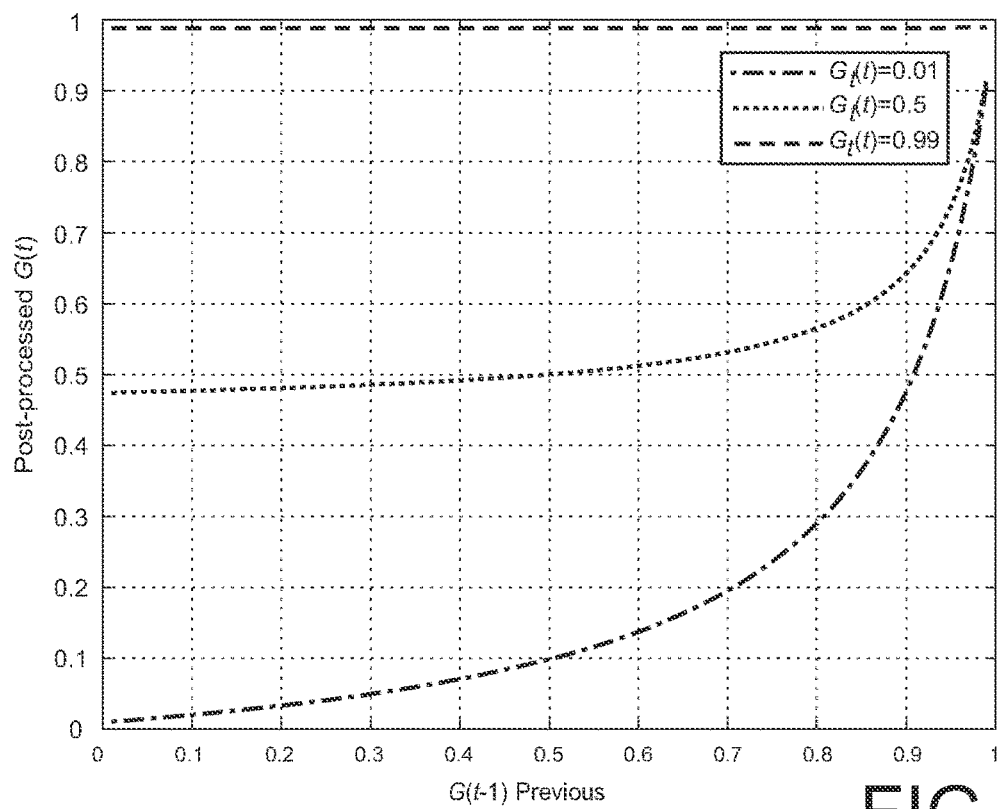

Thus, the estimated $\hat{R}_{PRIO}(t)$ is a smoothed version of $R_{POST}(k,t)$, which helps to counter the musical noise effect. The value of parameter $\alpha$ has significant impact on the final gain. FIGS. 5A and 5B show a plot of G(t) vs. both $G_r(t)$ and G(t−1) and a plot of G(t) vs. G(t−1) for various values of $G_r(t)$ for the parameter $\alpha$=0.02. FIGS. 6A and 6B show a plot of G(t) vs. both $G_r(t)$ and G(t−1) and a plot of G(t) vs. G(t−1) for various values of $G_r(t)$ for the parameter $\alpha$=0.5, and FIGS. 7A and 7B show a plot of G(t) vs. both $G_r(t)$ and G(t−1) and a plot of G(t) vs. G(t−1) for various values of $G_r(t)$ for the parameter $\alpha$=0.9.

Comparing these results for the three settings of $\alpha$, one can see that a smaller $\alpha$ reduces the impact of current instantaneous gain $G_r(t)$. For example, with $\alpha$=0.02 (see FIGS. 5A and 5B), $G_r(t)$=0.01 and $G_r(t)$=0.5 almost have no impact on G(t−1), so that G(t) follows G(t−1). This will lead to highly smoothed gains as new gains make very little contributions. When $G_r(t)$=0.99, the impact of $G_r(t)$ starts to kick in, which is desired for speech signals because it is desirable to avoid over-smoothing in the case of speech onset. One notable drawback with this setting $\alpha$=0.02 is the elevated noise floor after speech offset, which is reflected by higher G(t) values when $G_r(t)$ is small and G(t−1) is large. On the other hand, with $\alpha$=0.9 (see FIGS. 7A and 7B), $G_r(t)$ exerts much more influence on the final output G(t). For instance, when $G_r(t)$=0.99, it totally dominates the smoothing operation regardless of the previous gain value, G(t−1), which would result in perfect speech onset performance. This setting also shows improved performance for the speech offset case characterized by high $G_r(t)$ and low $G(t-1)$, although it may take a few iterations to push down the value of $G(t)$. The disadvantage of this high $\alpha$ setting is its insufficient smoothing for medium to low gain values.

Some embodiments of the present invention further include making the smoothing factor of the SNR smoothing filter dependent on the gain delta. We call this method decision-directed delta (DDD) gain smoothing.

In one embodiment of DDD gain smoothing, the method includes the converting of Eq. 10 to a SNR, and using a smoothing filter on the SNR to determine a smoothed a priori SNR to use for determining the post-processed gain, the smoothing factor being weighted by the gain delta. In particular, again omitting the frequency bin k dependence, $$\hat{R}_{PRIO}(k, t) = \frac{G(k, t-1)}{1-G(k, t-1)} + \alpha |G_t(t) - G(t-1)|^\beta \left( \frac{G_t(k, t)}{1-G_t(k, t)} - \frac{G(k, t-1)}{1-G(k, t-1)} \right) \quad (13)$$

The method further includes converting the smoothed a priori SNR to a post-processed gain, e.g., using Eq. 12.

Similar to the delta gain smoothing, we can also derive a series of variants of the decision-directed and the DDD gain smoothing methods' basic forms. For example, we may disable smoothing when the gains or gain deltas are large. External VAD can also be employed to control the DDD gain smoothing process.

Figure 8A:
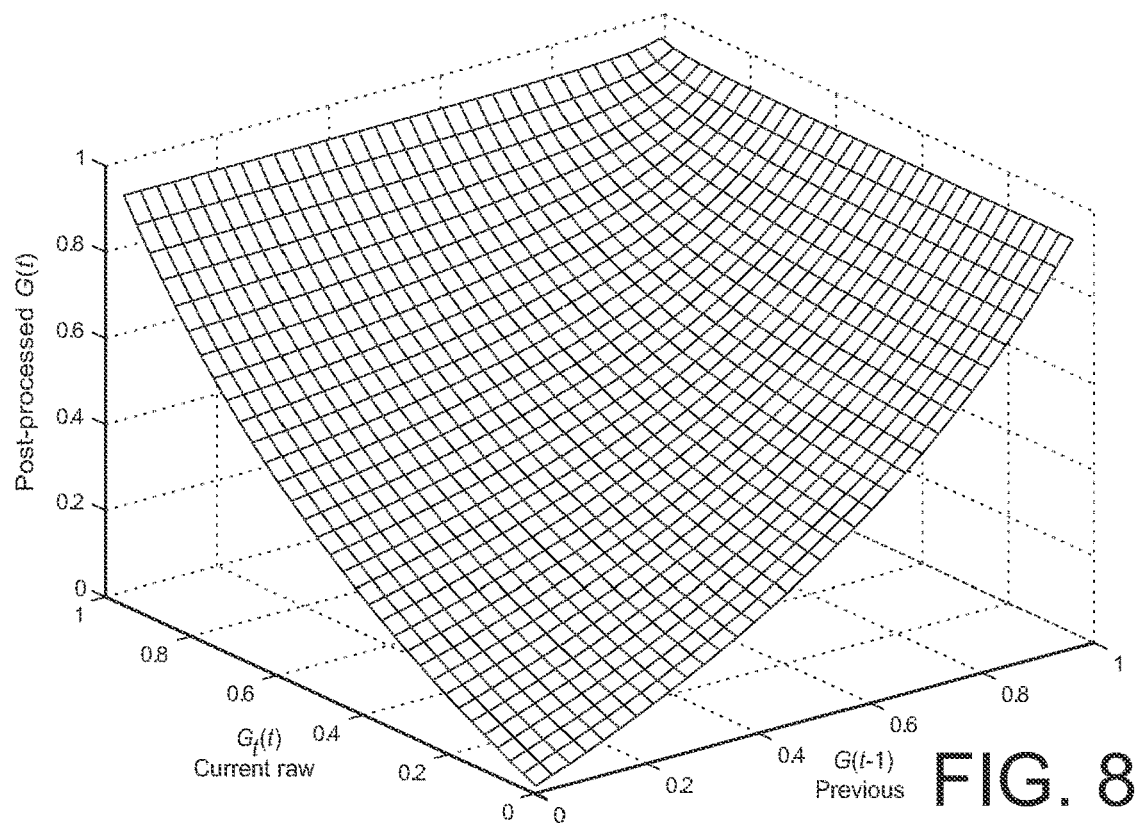
FIGS. 8A and 8B show a surface plot and several 2D plots of the post-processed gain that results by applying a decision-directed delta gain smoothing method of an embodiment of the invention.
Figure 8B:
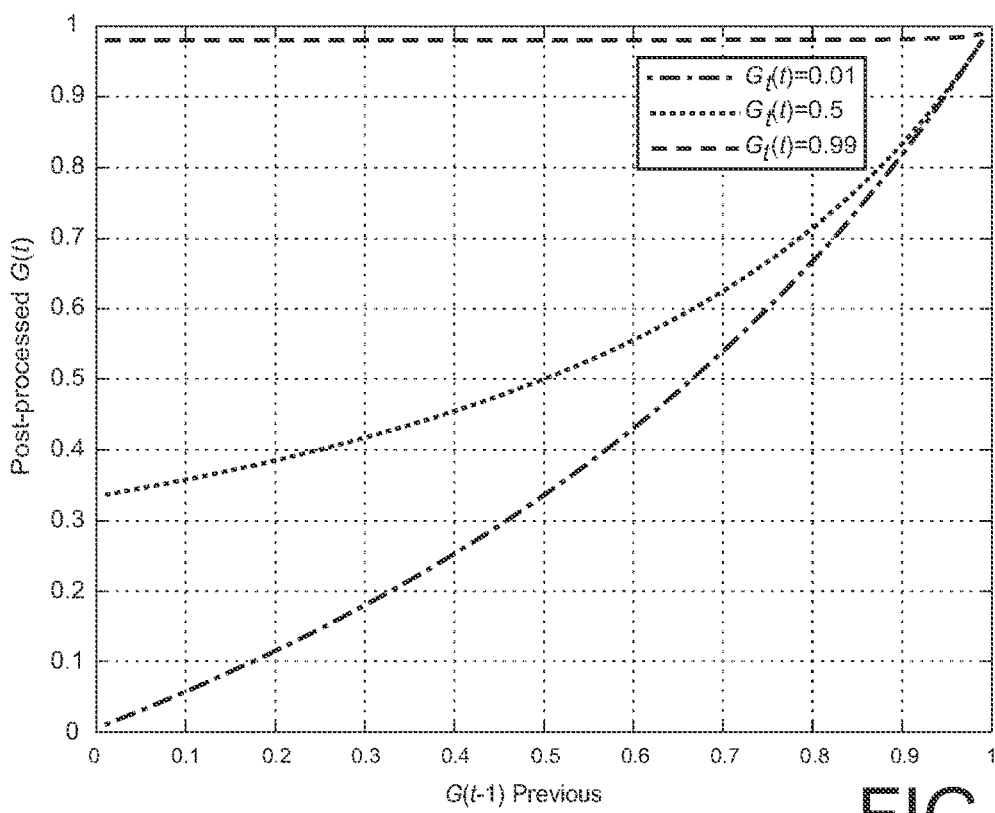

FIGS. 8A and 8B show a plot of $G(t)$ vs. both $G_r(t)$ and $G(t-1)$ and a plot of $G(t)$ vs. $G(t-1)$ for various values of $G_r(t)$ for an embodiment of DDD gain smoothing according to Eqs. 10, 12 and 13, with the parameter $\alpha=1$ and $\beta=0.5$.

Comparing this plot with the results for the delta gain smoothing shown in FIGS. 4A and 4B, several differences may be noted. First, when $G_r(t)$ is high, representing the speech onset case, there is a dip in the middle for delta smoothing (see the $G_r(t)=0.99$ curve in FIG. 4B), whereas the smoothed $G(t)$ stays flat with DDD smoothing as shown in FIG. 8B. Presumably DDD gain smoothing should preserve speech onset well. Second, when $G_r(t)$ is small (see, e.g., the $G_r(t)=0.01$ curves in FIGS. 4B and 8B), the two methods behave similarly when $G(t-1)$ is less than roughly 0.5. With the increase of previous gain $G(t-1)$, delta smoothing (FIG. 4B) starts to push down the gain $G(t)$, while with DDD gain smoothing (FIG. 8B), $G(t)$ increases slowly with increase in $G(t-1)$. Thus for this case, DDD gain smoothing could result in some elevated noise floor after speech offset. However, the $G_r(t)=0.01$ curve indicates that $G(t)$ would converge to $G_r(t)$ quickly after several iterations. Third, when both $G_r(t)$ and $G(t-1)$ are relatively small, which implies the signal is likely not to contain speech, e.g., be mostly noise, the two methods exhibit similar trend, with delta smoothing appearing to be on the more aggressive side in terms of smoothing.

While one embodiment uses the decision-directed or the DDD gain smoothing method of Eqs. 10, 12 and 13 as described above, alternative embodiments use variants of these methods. One alternate embodiment takes into account that during speech, it may be desirable to preserve voice quality.

One such embodiment includes disabling smoothing when the gains are above a pre-defined threshold. In one example, $G(t)$ is determined according to the decision-directed or the DDD gain smoothing method of Eqs. 10, 12 and 13 if $G_r(t) \leq Th$, and $G(t)=G_r(t)$ otherwise, where Th is a pre-defined threshold between 0 and 1. In one embodiment, a value of Th=0.4 is used. In general, a higher Th will let more gains slip through the smoothing process, with the smoothing being more aggressive. Other reasonable values of Th could be 0.5, 0.6, and so forth.

In another embodiment, smoothing is disabled when the gain deltas are large. In one example, $G(t)$ is determined according to the decision-directed or the DDD gain smoothing method of Eqs. 10, 12 and 13 if $|G_r(t)-G(t-1)|^\beta \leq Th$, and $G(t)=G_r(t)$ otherwise. Again, Th is a pre-defined threshold between 0 and 1. In one embodiment, a value of Th=0.4 is used. In general, a higher Th will let more gains slip through the smoothing process, with the smoothing being more aggressive. Other reasonable values of Th could be 0.5, 0.6, and so forth.

In yet another embodiment, a voice activity detector (VAD) or voice activity detection method is used, and the smoothing is controlled according to the output of the VAD. Thus, in one version, $G(t)$ is determined according to the decision-directed or the DDD gain smoothing method of Eqs. 10, 12 and 13 if the VAD indicates no voice, and $G(t)=G_r(t)$ otherwise.

In another embodiment in which a VAD is used, one embodiment uses less aggressive smoothing during voice activity as detected by the VAD, e.g., DDD smoothing according to Eqs. 10, 12 and 13 with $\alpha=1$ and $\beta=0.5$, and more aggressive DDD smoothing according to Eqs. 10, 12 and 13 when the VAD indicates no voice, e.g., $\alpha=1$ and $\beta=2$.

According to yet another embodiment, additionally or instead, the method includes smoothing the gain according to the decision-directed or the DDD gain smoothing method of Eqs. 10, 12 and 13 only when there is a predefined gain change direction. For example, the method includes smoothing the gain according to Eqs. 10, 12, and 13 when there is a gain increase. As another example, the method includes smoothing the gain according to Eqs. 10, 12, and 13 only when there is a gain decrease.

In yet another embodiment, the decision-directed or the DDD gain smoothing method according to Eqs. 10, 12, and 13 or the variations above and the raw gain are combined. This is appropriate, for example, if the DDD smoothing is deemed too aggressive. In one version, the final gain to use, denoted $G(k,t)$, is $$G(t) = \alpha_c G_{SMOOTH}(t) + (1-\alpha_c)G_r(t),$$

where $G_{SMOOTH}(t)$ is as determined by a decision-directed or DDD gain smoothing method as described by Eqs. 10, 12, and 13, alone, or in the variations described above. In one version, a value of a, is 0.5 is used. A reasonable range of values for a, is between 0.4 and 0.9.

In the above versions of decision-directed and DDD gain smoothing, the smoothing was only temporal. Other embodiments include frequency dependent gain smoothing. One such set of embodiments of delta gain smoothing include making the smoothing factor frequency bin dependent. For example, the smoothing factor $\alpha$ in Eq. 11 or Eq. 13 can be made frequency dependent with pre-defined values that yield different amount of smoothing for different frequencies. Another example embodiment uses the following variation of frequency. For this, the frequency bin k, k=0, . . . , N−1. is included in the notation:

Denote $$\alpha_{fd}(k) = \frac{k+1}{k+|G_t(k, t) - G(k, t-1)|^{-\beta}}. \quad (14)$$

Then, for one version of frequency dependent smoothing, Eq. 11 is replaced by $$\hat{R}_{PRIO}(k, t) = \frac{G(k, t-1)}{1 - G(k, t-1)} + \left(\alpha \cdot \alpha_{fd}(k)\left(\frac{G_r(k, t)}{1 - G_r(k, t)} - \frac{G(k, t-1)}{1 - G(k, t-1)}\right)\right) \quad (15)$$

With this formulation using Eqs. 10, 12, and 15 for gain smoothing, $\alpha_{fd}(k,t)$ is equal to $|G_r(k,t)-G(k,t-1)|^\beta$ for the lowest frequency bin, i.e. k=0, whereas as frequency bin k becomes larger, the contribution of the delta term $|G_r(k,t)-G(k,t-1)|^\beta$ diminishes, and eventually $\alpha_{fd}(k,t)$ becomes 1 or very close thereto.

Alternate embodiments use different frequency dependent smoothing factors $\alpha_{fd}(k,t)$ that have the property that for the lowest k, $\alpha_{fd}(k,t)$ is equal to $|G_r(k,t)-G(k,t-1)|^\beta$ and as frequency bin k becomes larger, eventually $\alpha_{fd}(k,t)$ becomes 1 or very close thereto.

While in the above-described embodiments of decision-directed gain smoothing and DDD gain smoothing, the converting of the raw gain to a SNR and the inverse of converting the smoothed SNR into a post-processed gain uses a Wiener filter relationship, alternate embodiments use alternate methods of converting from a raw gain to an SNR and the inverse to a post-processed gain. One alternate embodiment uses a spectral power subtraction relationship according to which:

$$R_{PRIO}(k, t) = \left(\frac{G_r^2(k, t)}{1 + G_r^2(k, t)}\right).$$

For decision-directed gain smoothing, $$\hat{R}_{PRIO}(k, t) = \frac{G^2(k, t-1)}{1 - G^2(k, t-1)} + \alpha\left(\frac{G_r^2(k, t)}{1 + G_r^2(k, t)} - \frac{G^2(k, t-1)}{1 - G^2(k, t-1)}\right).$$

For DDD smoothing, $$\hat{R}_{PRIO}(k, t) = \frac{G^2(k, t-1)}{1 - G^2(k, t-1)} + \alpha|G_r(t) - G(t-1)|^\beta\left(\frac{G_r^2(k, t)}{1 + G_r^2(k, t)} - \frac{G^2(k, t-1)}{1 - G^2(k, t-1)}\right).$$

Also, $$G(t) = \left(\frac{\hat{R}_{PRIO}(k, t)}{1 + \hat{R}_{PRIO}(k, t)}\right)^{0.5}.$$

Other alternative conversions also may be used.

Note that one feature of both delta gain smoothing and decision-directed delta gain smoothing is that the post-processing methods are relatively computationally efficient, and that the calculation depends solely on the gain itself, which makes them applicable to a wide range of gain functions.

Hybrid Gain Smoothing

Other embodiments include determining a first smoothed gain using delta gain smoothing, determining a second smoothed gain using decision-directed gain smoothing, and combining the first and the second smoothed gains to generate the post-processed gain. In some such embodiments, the combining depends on signal classification, e.g., whether the input is likely to be voice.

A first such embodiment uses a gain which is a product of a first gain determined using delta gain smoothing and a second gain determined using DDD gain smoothing. A second such embodiment uses a method for ascertaining whether the input is likely or not to be voice, and includes using delta gain smoothing for the voice portion and DDD gain smoothing for the unvoiced portion. Yet another such embodiment includes using delta gain smoothing for the unvoiced portion and DDD gain smoothing for the voiced portion. Yet another embodiment that includes using both delta gain smoothing and DDD gain smoothing uses delta gain smoothing for frequency bins corresponding to a low frequency region and DDD gain smoothing for the remaining (high frequency) frequency bins. Yet another embodiment includes using both delta gain smoothing and DDD gain smoothing for frequency bins corresponding to a low frequency region and delta gain smoothing for the remaining (high frequency) frequency bins.

A Processing System-Based Apparatus

Figure 9:
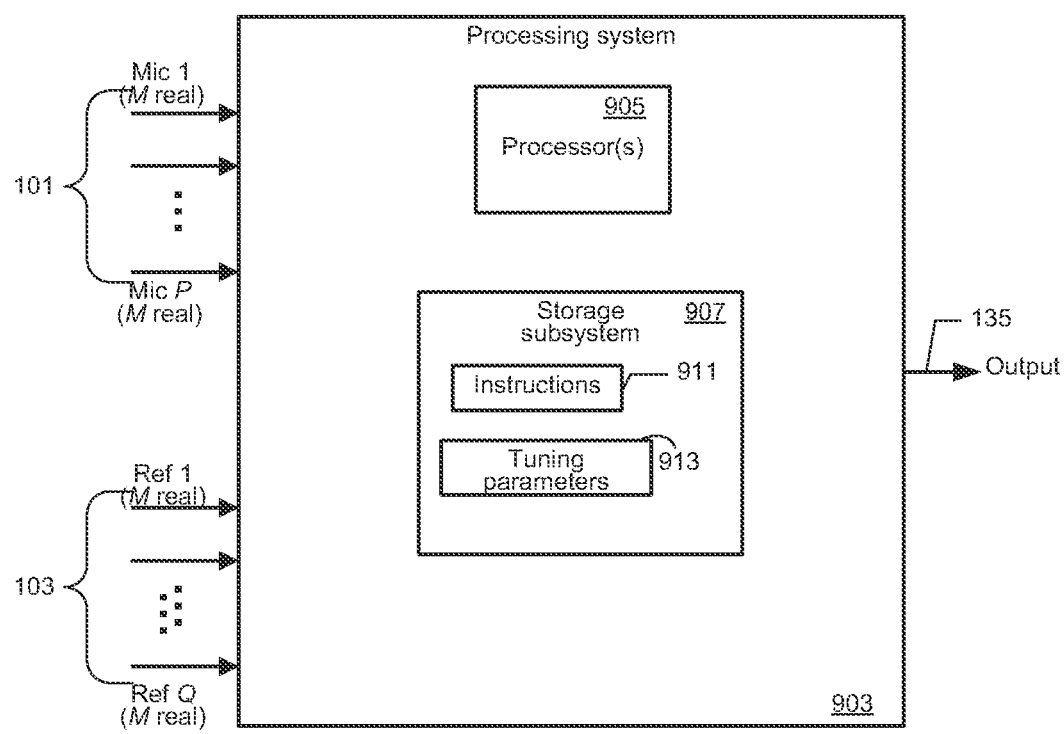
FIG. 9 shows a simplified block diagram of a processing apparatus embodiment for processing one or more audio inputs to determine a set of raw gains, to post-process the raw gains including smoothing the determined raw gains according to the smoothing methods described herein, and to generate audio output that has been modified by application of the post-processed gains.

FIG. 9 shows a simplified block diagram of one processing apparatus embodiment 900 for processing one or more of audio inputs 101, e.g., from microphones (not shown). The processing apparatus 900 is to determine a set of gains, to post-process the gains according to an embodiment of the present invention, and to generate audio output 137 that has been modified by application of the post-processed gains. One version achieves one or more of perceptual domain-based leveling, perceptual domain-based dynamic range control, and perceptual domain-based dynamic equalization that takes into account the variation in the perception of audio depending on the reproduction level of the audio signal. Another version achieves noise reduction.

One embodiment carries out noise reduction on a single microphone input audio signal. Such a version includes only the input and output.

Another embodiment also includes echo reduction, and in such a version, the processing apparatus also accepts one or more reference signals 103, e.g., from one or more loudspeakers (not shown) or from the feed(s) to such loudspeaker(s).

In one such noise reduction version, the processing apparatus 900 is to generate audio output 137 that has been modified by suppressing, in one embodiment noise and out-of-location signals, and in another embodiment also echoes as specified in accordance to one or more features of the present invention. The apparatus, for example, can implement the system shown in FIG. 1B, and any alternates thereof, and can carry out, when operating, the method of FIG. 8 including any variations of the method described herein. Such an apparatus may be included, for example, in a headphone set such as a Bluetooth headset. The audio inputs 101, the reference input(s) 103 and the audio output 137 are assumed to be in the form of frames of M samples of sampled data. In the case of analog input, a digitizer including an analog-to-digital converter and quantizer would be present. For audio playback, a de-quantizer and a digital-to-analog converter would be present. Such and other elements that might be included in a complete audio processing system, e.g., a headset device are left out, and how to include such elements would be clear to one skilled in the art.

The embodiment shown in FIG. 9 includes a processing system 903 that is configured in operation to carry out the suppression methods described herein. The processing system 903 includes at least one processor 905, which can be the processing unit(s) of a digital signal processing device, or a CPU of a more general purpose processing device. The processing system 903 also includes a storage element, e.g., a storage subsystem 907 typically including one or more memory elements. The elements of the processing system are coupled, e.g., by a bus subsystem or some other interconnection mechanism not shown in FIG. 9. Some of the elements of processing system 903 may be integrated into a single circuit, using techniques commonly known to one skilled in the art.

The storage subsystem 907 includes instructions 911 that when executed by the processor(s) 905, cause carrying out of the methods described herein.

In some embodiments, the storage subsystem 907 is configured to store one or more tuning parameters 913 that can be used to vary some of the processing steps carried out by the processing system 903.

The system shown in FIG. 9 can be incorporated in a specialized device such as a headset, e.g., a wireless Bluetooth headset. The system also can be part of a general purpose computer, e.g., a personal computer configured to process audio signals.

General

Unless specifically stated otherwise, it is appreciated that throughout the specification discussions using terms such as "generating," "processing," "computing," "calculating," "determining" or the like, may refer to, without limitation, the action and/or processes of hardware, e.g., an electronic circuit, a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include one or more processors.

Note that when a method is described that includes several elements, e.g., several steps, no ordering of such elements, e.g., of such steps is implied, unless specifically stated.

The methodologies described herein are, in some embodiments, performable by one or more processors that accept logic, instructions encoded on one or more computer-readable media. When executed by one or more of the processors, the instructions cause carrying out at least one of the methods described herein. Any processor capable of executing a set of instructions (sequential or otherwise) that specify actions to be taken is included. Thus, one example is a typical processing system that includes one or more processors. Each processor may include one or more of a CPU or similar element, a graphics processing unit (GPU), field-programmable gate array, application-specific integrated circuit, and/or a programmable DSP unit. The processing system further includes a storage subsystem with at least one storage medium, which may include memory embedded in a semiconductor device, or a separate memory subsystem including main RAM and/or a static RAM, and/or ROM, and also cache memory. The storage subsystem may further include one or more other storage devices, such as magnetic and/or optical and/or further solid state storage devices. A bus subsystem may be included for communicating between the components. The processing system further may be a distributed processing system with processors coupled by a network, e.g., via network interface devices or wireless network interface devices. If the processing system requires a display, such a display may be included, e.g., a liquid crystal display (LCD), organic light emitting display (OLED), or a cathode ray tube (CRT) display. If manual data entry is required, the processing system also includes an input device such as one or more of an alphanumeric input unit such as a keyboard, a pointing control device such as a mouse, and so forth. The term storage element, storage device, storage subsystem, or memory unit as used herein, if clear from the context and unless explicitly stated otherwise, also encompasses a storage system such as a disk drive unit. The processing system in some configurations may include a sound output device, and a network interface device.

In some embodiments, a non-transitory computer-readable medium is configured with, e.g., encoded with instructions, e.g., logic that when executed by one or more processors of a processing system such as a digital signal processing device or subsystem that includes at least one processor element and a storage element, e.g., a storage subsystem, cause carrying out a method as described herein. Some embodiments are in the form of the logic itself. A non-transitory computer-readable medium is any computer-readable medium that is not specifically a transitory propagated signal or a transitory carrier wave or some other transitory transmission medium. The term "non-transitory computer-readable medium" thus covers any tangible computer-readable storage medium. Non-transitory computer-readable media include any tangible computer-readable storage media and may take many forms including non-volatile storage media and volatile storage media. Non-volatile storage media include, for example, static RAM, optical disks, magnetic disks, and magneto-optical disks. Volatile storage media includes dynamic memory, such as main memory in a processing system, and hardware registers in a processing system. In a typical processing system as described above, the storage element is a computer-readable storage medium that is configured with, e.g., encoded with instructions, e.g., logic, e.g., software that when executed by one or more processors, causes carrying out one or more of the method steps described herein. The software may reside in the hard disk, or may also reside, completely or at least partially, within the memory, e.g., RAM and/or within the processor registers during execution thereof by the computer system. Thus, the memory and the processor registers also constitute a non-transitory computer-readable medium on which can be encoded instructions to cause, when executed, carrying out method steps.

While the computer-readable medium is shown in an example embodiment to be a single medium, the term "medium" should be taken to include a single medium or multiple media (e.g., several memories, a centralized or distributed database, and/or associated caches and servers) that store the one or more sets of instructions.

Furthermore, a non-transitory computer-readable medium, e.g., a computer-readable storage medium may form a computer program product, or be included in a computer program product.

In alternative embodiments, the one or more processors operate as a standalone device or may be connected, e.g., networked to other processor(s), in a networked deployment, or the one or more processors may operate in the capacity of a server or a client machine in server-client network environment, or as a peer machine in a peer-to-peer or distributed network environment. The term processing system encompasses all such possibilities, unless explicitly excluded herein. The one or more processors may form a personal computer (PC), a media playback device, a headset device, a hands-free communication device, a tablet PC, a set-top box (STB), a personal digital assistant (PDA), a game machine, a cellular telephone, a Web appliance, a network router, switch or bridge, or any machine capable of executing a set of instructions (sequential or otherwise) that specify actions to be taken by that machine.

Note that while some diagram(s) only show(s) a single processor and a single storage element, e.g., a single memory that stores the logic including instructions, those skilled in the art will understand that many of the components described above are included, but not explicitly shown or described in order not to obscure the inventive aspect. For example, while only a single machine is illustrated, the term "machine" shall also be taken to include any collection of machines that individually or jointly execute a set (or multiple sets) of instructions to perform any one or more of the methodologies discussed herein.

Thus, as will be appreciated by those skilled in the art, embodiments of the present invention may be embodied as a method, an apparatus such as a special purpose apparatus, an apparatus such as a data processing system, logic, e.g., embodied in a non-transitory computer-readable medium, or a computer-readable medium that is encoded with instructions, e.g., a computer-readable storage medium configured as a computer program product. The computer-readable medium is configured with a set of instructions that when executed by one or more processors cause carrying out method steps. Accordingly, aspects of the present invention may take the form of a method, an entirely hardware embodiment, an entirely software embodiment or an embodiment combining software and hardware aspects. Furthermore, the present invention may take the form of program logic, e.g., a computer program on a computer-readable storage medium, or the computer-readable storage medium configured with computer-readable program code, e.g., a computer program product.

It will also be understood that embodiments of the present invention are not limited to any particular implementation or programming technique and that the invention may be implemented using any appropriate techniques for implementing the functionality described herein. Furthermore, embodiments are not limited to any particular programming language or operating system.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the DESCRIPTION OF EXAMPLE EMBODIMENTS are hereby expressly incorporated into this DESCRIPTION OF EXAMPLE EMBODIMENTS, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those skilled in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified, the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

While in one embodiment, the short time Fourier transform (STFT) is used to obtain the frequency bands, the invention is not limited to the STFT. Transforms such as the STFT are often referred to as circulant transforms. Most general forms of circulant transforms can be represented by buffering, a window, a twist (real value to complex value transformation) and a DFT, e.g., FFT. A complex twist after the DFT can be used to adjust the frequency domain representation to match specific transform definitions. The invention may be implemented by any of this class of transforms, including the modified DFT (MDFT), the short time Fourier transform (STFT), and with a longer window and wrapping, a conjugate quadrature mirror filter (CQMF). Other standard transforms such as the Modified discrete cosine transform (MDCT) and modified discrete sine transform (MDST), can also be used, with an additional complex twist of the frequency domain bins, which does not change the underlying frequency resolution or processing ability of the transform and thus can be left until the end of the processing chain, and applied in the remapping if required.

All U.S. patents, U.S. patent applications, and International (PCT) patent applications designating the United States cited herein are hereby incorporated by reference, except in those jurisdictions that do not permit incorporation by reference, in which case the Applicant reserves the right to insert any portion of or all such material into the specification by amendment without such insertion considered new matter. In the case the patent rules or statutes do not permit incorporation by reference of material that itself incorporates information by reference, the incorporation by reference of the material herein excludes any information incorporated by reference in such incorporated by reference material, unless such information is explicitly incorporated herein by reference.

Any discussion of other art in this specification should in no way be considered an admission that such art is widely known, is publicly known, or forms part of the general knowledge in the field at the time of invention.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting of only elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limitative to direct connections only. The terms "coupled" and "connected," along with their derivatives, may be used. It should be understood that these terms are not intended as synonyms for each other, but may be. Thus, the scope of the expression "a device A coupled to a device B" should not be limited to devices or systems wherein an input or output of device A is directly connected to an output or input of device B. It means that there exists a path between device A and device B which may be a path including other devices or means in between. Furthermore, "coupled to" does not imply direction. Hence, the expression "a device A is coupled to a device B" may be synonymous with the expression "a device B is coupled to a device A." "Coupled" may mean that two or more elements are either in direct physical or electrical contact, or that two or more elements are not in direct contact with each other but yet still co-operate or interact with each other.

In addition, use of the "a" or "an" are used to describe elements and components of the embodiments herein. This is done merely for convenience and to give a general sense of the invention. This description should be read to include one or at least one and the singular also includes the plural unless it is obvious that it is meant otherwise.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added to or deleted from methods described within the scope of the present invention.

We claim:

1. An audio processing apparatus, comprising:
   at least one processor; and
   at least one memory storing a computer program;
   in which the at least one memory with the computer program is configured with the at least one processor to cause the audio processing apparatus to at least:
   receive a plurality of audio signals,
   analyze the plurality of audio signals to determine a raw dynamic range control (DRC) gain, wherein the raw DRC gain depends on a combined level of the plurality of audio signals,
   select a raw DRC gain smoothing factor from a plurality of raw DRC gain smoothing factors in response to a comparison of the raw DRC gain to a previous smoothed DRC gain, wherein the plurality of raw DRC gain smoothing factors corresponds to a plurality of raw DRC gain smoothing time durations;
   determine a current smoothed DRC gain from the raw DRC gain, the previous smoothed DRC gain, and the selected raw DRC gain smoothing factor; and
   control a dynamic range of one or more of the plurality of audio signals by applying the current smoothed DRC gain to one or more of the plurality of audio signals.

2. The audio processing apparatus of claim 1, wherein the plurality of audio signals comprise a plurality of frames.

3. The audio processing apparatus of claim 2, wherein the raw DRC gain corresponds to a current frame of the plurality of frames of the plurality of audio signals.

4. The audio processing apparatus of claim 2, wherein the current smoothed DRC gain corresponds to a current frame of the plurality of frames of the plurality of audio signals.

5. The audio processing apparatus of claim 2, wherein the previous smoothed DRC gain corresponds to a smoothed DRC gain of a previous frame of the plurality of frames of the plurality of audio signals.

6. The audio processing apparatus of claim 5, wherein the previous frame of the plurality of frames of the plurality of audio signals immediately precedes a current frame of the plurality of frames of the plurality of audio signals.

7. The audio processing apparatus of claim 2, wherein a current frame of the plurality of frames of the plurality of audio signals is transformed into a transform domain, the plurality of audio signals are analyzed in the transform domain, and the current smoothed DRC gain is applied to one or more of the plurality of audio signals in the transform domain.

8. The audio processing apparatus of claim 1, wherein the smoothed DRC gain is applied to each of the plurality of audio signals.

9. A program storage device readable by a machine, tangibly embodying a program of instructions executable by one or more processors of the machine for causing to perform operations, said operations comprising:
   receiving a plurality of audio signals,
   analyzing the plurality of audio signals to determine a raw dynamic range control (DRC) gain, wherein the raw DRC gain depends on a combined level of the plurality of audio signals;
   selecting a raw DRC gain smoothing factor from a plurality of raw DRC gain smoothing factors in response to a comparison of the raw DRC gain to a previous smoothed DRC gain, wherein the plurality of raw DRC gain smoothing factors corresponds to a plurality of raw DRC gain smoothing time durations;

determining a current smoothed DRC gain from the raw DRC gain, the previous smoothed DRC gain, and the selected raw DRC gain smoothing factor; and controlling a dynamic range of one or more of the plurality of audio signals by applying the current smoothed DRC gain to one or more of the plurality of audio signals.

10. A method, performed by an audio processing apparatus, the method comprising:

receiving a plurality of audio signals, analyzing the plurality of audio signals to determine a raw dynamic range control (DRC) gain, wherein the raw DRC gain depends on a combined level of the plurality of audio signals;

selecting a raw DRC gain smoothing factor, from a plurality of raw DRC gain smoothing factors, in response to a comparison of the raw DRC gain to a previous smoothed DRC gain, wherein the plurality of raw DRC gain smoothing factors corresponds to a plurality of raw DRC gain smoothing time durations;

determining a current smoothed DRC gain from the raw DRC gain, the previous smoothed DRC gain, and the selected raw DRC gain smoothing factor; and controlling a dynamic range of one or more of the plurality of audio signals by applying the current smoothed DRC gain to one or more of the plurality of audio signals.

* * * * *